(12) United States Patent
Ozaki et al.

(10) Patent No.: US 8,956,967 B2
(45) Date of Patent: Feb. 17, 2015

(54) METHOD OF FORMING AN INTERCONNECTION STRUCTURE

(75) Inventors: Shirou Ozaki, Kawasaki (JP); Yoshihiro Nakata, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 22 days.

(21) Appl. No.: 13/608,644

(22) Filed: Sep. 10, 2012

(65) Prior Publication Data
US 2012/0325920 A1 Dec. 27, 2012

Related U.S. Application Data

(63) Continuation of application No. PCT/JP2010/060757, filed on Jun. 24, 2010.

(51) Int. Cl.
*H01L 21/4763* (2006.01)
*H01L 23/12* (2006.01)
*H01L 23/532* (2006.01)
(Continued)

(52) U.S. Cl.
CPC .... *H01L 23/53238* (2013.01); *H01L 21/02063* (2013.01); *H01L 21/67069* (2013.01); *H01L 21/67109* (2013.01); *H01L 21/76807* (2013.01); *H01L 21/76814* (2013.01); *H01L 23/485* (2013.01); *H01L 23/53295* (2013.01);
(Continued)

(58) Field of Classification Search
CPC .................. H01L 21/76802; H01L 21/76807; H01L 21/76895; H01L 21/76838; H01L 21/76843; H01L 21/76846; H01L 21/7684; H01L 21/7687; H01L 23/5226
See application file for complete search history.

(56) References Cited

U.S. PATENT DOCUMENTS 6,730,594 B2 * 5/2004 Noguchi et al. .............. 438/653
2003/0025207 A1 2/2003 Harada
(Continued)

FOREIGN PATENT DOCUMENTS

| JP | 63-263727 A | 10/1988 |
| JP | 11-016912 A | 1/1999 |

(Continued)

OTHER PUBLICATIONS

Ozaki, S. et al., "Effect of fluorine contamination on barrier metal oxidation", Microelectronic Engineering 87, 2010, p. 370-372, cited in specification.
(Continued)

*Primary Examiner* — Alonzo Chambliss
(74) *Attorney, Agent, or Firm* — Westerman, Hattori, Daniels & Adrian, LLP

(57) ABSTRACT

A method of forming an interconnection structure includes forming an opening in an insulation film by a dry etching process that uses an etching gas containing fluorine; cleaning a bottom surface and a sidewall surface of the opening by exposing to a superheated steam; covering the bottom surface and the sidewall surface of the opening with a barrier metal film; depositing a conductor film on the insulation film via the barrier metal film to fill the opening with the conductor film; forming an interconnection pattern by the conductor film in the opening by polishing the conductor film and the barrier metal film underneath the conductor film by a chemical mechanical polishing process until a surface of the insulation film is exposed.

15 Claims, 36 Drawing Sheets

(51) Int. Cl.
  *H01L 21/02* (2006.01)
  *H01L 21/67* (2006.01)
  *H01L 21/768* (2006.01)
  *H01L 23/485* (2006.01)
  *H01L 21/3105* (2006.01)

(52) U.S. Cl.
  CPC ....... *H01L21/3105* (2013.01); *H01L 21/76843* (2013.01); *H01L 2924/0002* (2013.01)
  USPC .......... 438/626; 438/629; 438/633; 438/638; 257/700; 257/758; 257/774

(56) References Cited

U.S. PATENT DOCUMENTS

2006/0284317 A1  12/2006  Ito et al.
2010/0029086 A1  2/2010  Miyoshi et al.

FOREIGN PATENT DOCUMENTS

| JP | 2001-271192 A | 10/2001 |
| JP | 2003-045960 A | 2/2003 |
| JP | 2007-027680 A | 2/2007 |
| JP | 2007-149813 A | 6/2007 |
| JP | 2007-201070 A | 8/2007 |
| JP | 2008-226924 A | 9/2008 |

OTHER PUBLICATIONS

Ozaki, S. et al., "Evaluation of Barrier Metal Oxidation of Cu/Porous Low-k Multilevel Interconnects", 14th Colloquium on Atomic Transport and Stress Problems in LSI Wirings, 2009, pp. 33-34, w/ English abstract, cited in specification.

http://www.tlv.com/ja/steam story/0612rinkaisui.html, searched on Jun. 8, 2010, cited in specification.

International Search Report of PCT/JP2010/060757, mailing date of Sep. 21, 2010.

Japanese Office Action dated Aug. 27, 2013, issued in corresponding Japanese Patent Application No. 2012-521230, w/ English translation.

* cited by examiner

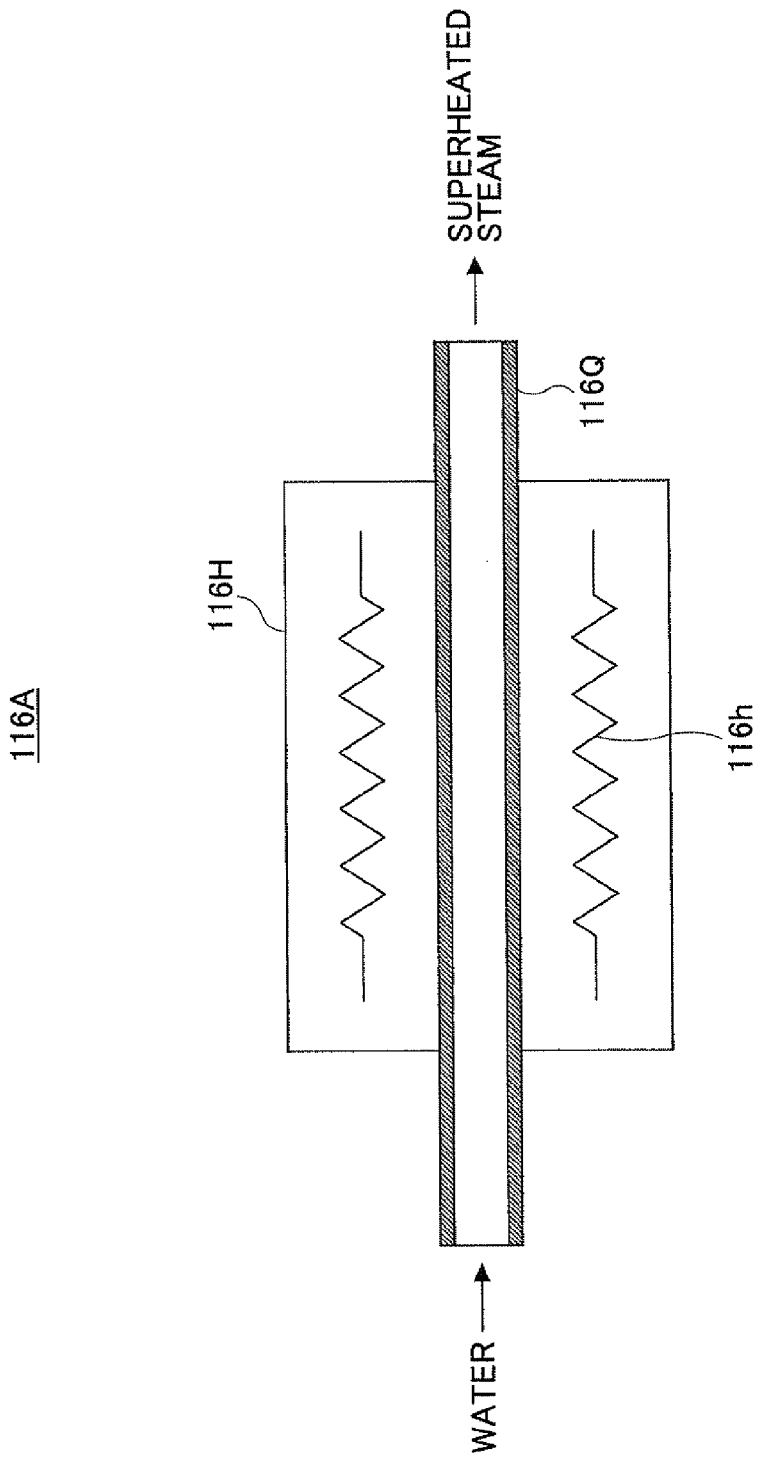

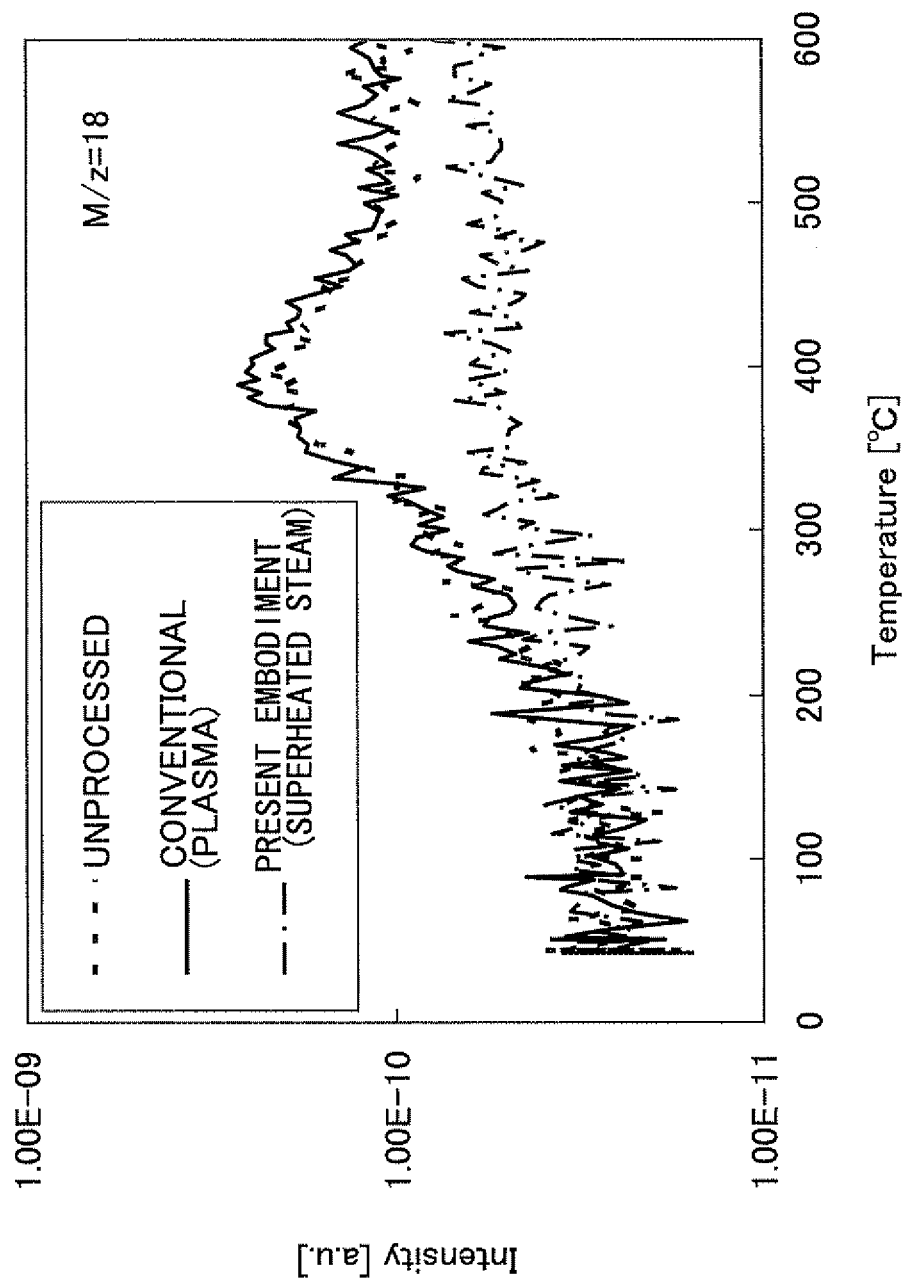

METHOD OF FORMING AN INTERCONNECTION STRUCTURE

CROSS-REFERENCE TO RELATED APPLICATIONS

This application is a U.S. continuation application filed under 35 USC 111a and 365c of PCT application JP2010/060757, filed Jun. 24, 2010. The foregoing application is hereby incorporated by reference.

FIELD

The embodiments described herein relate to fabrication of semiconductor devices.

BACKGROUND

In recent semiconductor integrated circuit devices, a vast number of semiconductor devices are formed on a common substrate, and a multilayer interconnection structure is used for interconnecting these semiconductor devices.

In a multilayer interconnection structure, a plurality of interlayer insulation films are laminated with each other wherein each of the interlayer insulation films includes an interconnection pattern that constitutes an interconnection layer in the form embedded therein. In such a multilayer interconnection structure, a lower interconnection layer is connected to an upper interconnection layer via a via-contact formed in an interlayer insulation film.

In recent ultra-miniaturized or ultra high-speed semiconductor devices, a low dielectric film (so-called low-K dielectric film) is used for the interlayer insulation films for reducing the problem of signal delay (RC delay) that takes place in the multilayer interconnection structure. Further, together with this, low resistance copper (Cu) patterns are used for the interconnection patterns.

In a multilayer interconnection structure in which a Cu interconnection pattern is embedded in a low-K interlayer insulation film, a so-called damascene process or dual damascene process is used extensively in view of the difficulty of patterning a Cu layer by way of dry etching process. In a damascene process or dual damascene process, interconnection trenches or via-holes are formed in the interlayer insulation film in advance, and a Cu layer is formed so as to fill the interconnection trenches or via-holes thus formed. Further, excessive Cu layer on the interlayer insulation film is removed by a chemical mechanical polishing (CMP) process.

In order to avoid the problem of short circuit or the like caused in such a structure by the Cu atoms invading into the interlayer insulation film by diffusion, which tends to occur when the Cu interconnection pattern has made a direct contact with the interlayer insulation film, it is practiced in the art to cover the sidewall surfaces and bottom surface of the interconnection trenches or via-holes, on which the Cu interconnection patterns are to be formed, by a conductive diffusion barrier or so-called barrier metal film, and to deposit the Cu layer on such a barrier metal film. For such barrier metal films, a refractory metal such as tantalum (Ta), titanium (Ti), Ruthenium (Ru), or the like, is used. Alternatively, a conductive nitride of such a refractory metal or stack of these films may be used.

PRIOR ART REFERENCES

Patent References

Patent Reference 1 Japanese Laid-Open Patent Application 11-16912
Patent Reference 2 Japanese Laid-Open Patent Application 2007-27680
Patent Reference 3 Japanese Laid-Open Patent Application 2003-45960
Patent Reference 4 Japanese Laid-Open Patent Application 2007-149813

Non-Patent References

Non-Patent Reference 1 Ozaki, S., et al., Microelectronic Engineering 87 (2010) pp. 370-372
Non-Patent Reference 2 Ozaki, Shirou, et al., 14th Colloquium on Atomic Transport and Stress Problems In LSI Wirings (2009), preprint, pp. 33-34
Non-Patent Reference 3 http://www.tlv.com/ja/steam story/0612rinkaisui.html (searched on Jun. 8, 2010).

SUMMARY

In a first aspect, a method of forming an interconnection structure includes forming an opening in an insulation film by a dry etching process that uses an etching gas containing fluorine, cleaning a bottom surface and a sidewall surface of the opening by exposing to a superheated steam, covering the bottom surface and the sidewall surface of the opening with a barrier metal film, depositing a conductor film on the insulation film and filling said opening with said conductor film via said barrier metal film, forming an interconnection pattern by the conductor film in the opening by polishing the conductor film and the barrier metal film underneath the conductor film by a chemical mechanical polishing process until a surface of the insulation film is exposed.

In a second aspect, a substrate processing apparatus includes a processing vessel evacuated by an evacuation system and accommodating therein a stage configured to hold a substrate, a superheated steam generator configured to supply a superheated steam to said processing vessel, a gas supplying apparatus supplying an inert gas or a reducing gas to said processing vessel, an oxygen concentration level measuring device configured to measure an oxygen concentration level in said processing vessel, and a heating mechanism provided in said stage and configured to heat said substrate on said stage to a temperature of said superheated steam to which said substrate is exposed, wherein said superheated steam generator supplies said superheated steam to said processing vessel with a temperature higher than a temperature of said substrate on the stage.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF DRAWINGS

FIG. 2B is a diagram representing an outline of a superheated steam generator used with the substrate processing apparatus of FIG. 2A;

FIG. 8B is a diagram representing a result of another TDS analysis conducted for the first embodiment;

DESCRIPTION OF EMBODIMENTS

Figure 1A:
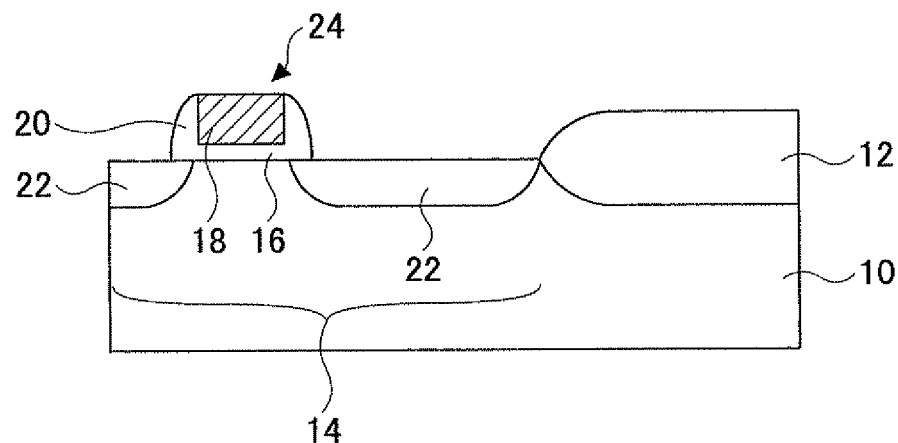
FIGS. 1A-1W are cross-sectional diagrams explaining the fabrication process of a semiconductor device according to a first embodiment.

In the following, embodiments will be described with reference to the accompanying drawings.

As noted previously, it is generally practiced, in the art of damascene process or dual damascene process, to form via-holes or interconnection trenches in an interlayer insulation film in advance in the form of opening by a dry etching process and to cover the opening thus formed by a barrier metal film. Further, it is often practiced in the art that the dry etching process is conducted by a plasma etching process while using fluorocarbon as the etching gas.

As noted previously, a Ta film or a Ti film or a conductive nitride film thereof, or a stack of appropriate combination of a Ti film, a Ta film, a TiN film, a TaN film and the like, may be used for the barrier metal film. Meanwhile, it has been discovered recently that such a barrier metal film, while being formed of a thermally and chemically stable metal film, nevertheless undergoes remarkable oxidation when there exist fluorine (F) and water ($H_2O$) at the sidewall surfaces or bottom surface of the opening formed in the interlayer insulation film immediately before formation of the barrier metal film. Reference should be made to Non-Patent References 1 and 2.

Immediately after formation of such an opening, it should be noted that there is a tendency that water ($H_2O$) remains on the sidewall surfaces or bottom surface of the opening. Further, there are often the cases in which the gas molecules used for the dry etching process such as fluorocarbon ($CF_x$) molecules are adsorbed and remain in addition to water. Further, there are cases in which the sidewall surfaces and bottom surface of the opening are terminated with fluorine (F) that has been a constituent component of the fluorocarbon etching gas.

It should be noted that such fluorine existing on the sidewall surfaces or bottom surface of the opening tends to cause formation of HF when there exists water at the same time, and HF thus formed works as a catalyst and induces a change of pH in the water. Such a change of pH in turn induces an oxidation-reduction reaction, and it is believed that it is such an oxidation-reduction reaction that promotes the oxidation of the refractory metal element such as Ta or Ti (Non-Patent Reference 1 and Non-Patent Reference 2). Even in the case the barrier metal film is formed of a conductive nitride film such as a TaN film or a TiN film, the problem of oxidation of the metal element such as Ta or Ti cannot be avoided in view of the fact that these metal nitride films generally have a non-stoichiometric composition represented as $Ta_xN_y$ or $Ti_xN_y$.

Similar oxidation of the barrier metal film by water and fluorine may take place also in other refractory metal elements such as Ru, Pt, Rh, Zr, Hf, V, Nb, Cr, Mo, W, Mn, and the like.

When such oxidation of the barrier metal film takes place in a Cu interconnection structure, the barrier metal may cause dilatation at the oxidized part, while such dilatation may lead to cracking in the barrier metal film and the adhesion to the interlayer film is deteriorated. Further, there may be caused diffusion of Cu toms from the Cu interconnection patterns or Cu via-plugs into the interlayer insulation film via the cracks thus formed, and there may be caused various problems such as deterioration of electric properties and degradation of the adhesion.

Conventionally, such a problem of oxidation of the barrier metal film has been avoided by removing the water or the terminating fluorine (F) from the bottom surface or sidewall surfaces of the opening formed in the interlayer film by applying thereto a plasma processing. However, such plasma processing may cause damages to the interlayer insulation film particularly in the case the interlayer insulation film is formed of a low-K dielectric of low density, and there is a concern that the surface of the interlayer insulation film changes to a hydrophilic surface. When this occurs, the water absorption rate of the interlayer insulation film is increased, while such increase of the water absorption rate tends to invite the problem of increase of specific dielectric constant of the interlayer insulation film.

Thus, there is a need of a forming method of a multilayer interconnection structure and also a fabrication method of a semiconductor device in which the problem of oxidation of the barrier metal film caused by the water and fluorine remaining in the opening in the interlayer insulation film can be successfully suppressed.

First Embodiment

Hereinafter, the fabrication process of a semiconductor device according to a first embodiment will be explained with reference to FIGS. 1A-1W.

Referring to FIG. 1A, there is formed a device isolation film 12 on a silicon substrate 10 by a LOCOS (Local Oxidation of Silicon) process such that the device isolation film 12 defines a device region 14.

Next, there is formed a gate electrode 18 over the silicon substrate 10 in the device region 14 via a gate insulation film 16, and sidewall insulation films 20 are formed on the respective sidewall surfaces of the gate electrode 18. Further, source and drain diffusion regions 22 are formed in the semiconductor substrate 18 at respective sides of the gate electrode 18 by introducing a dopant impurity element into the silicon substrate 10 while using the sidewall insulation films 20 and the gate electrode 18 as a mask. With this, there is formed a transistor 24 that includes the gate electrode 18 and the source and drain diffusion regions 22 as represented in FIG. 1A.

Figure 1B:
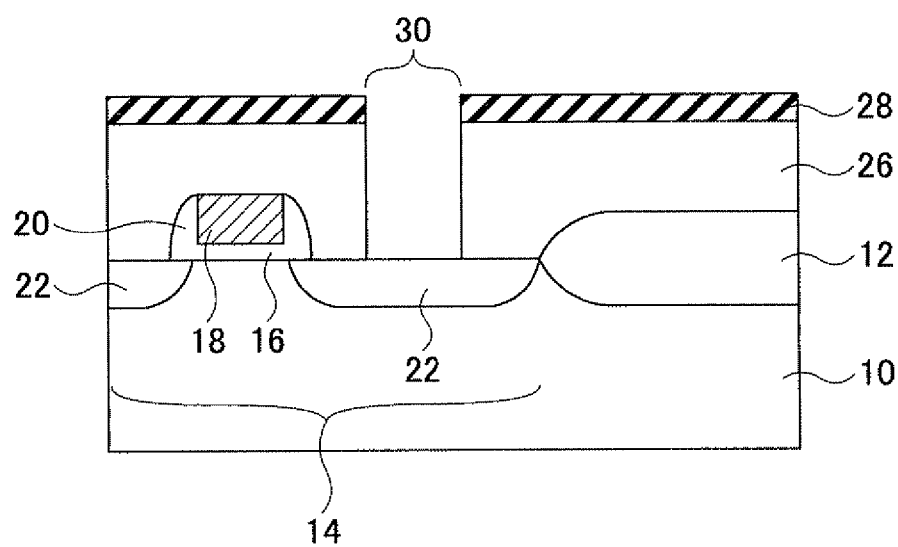

Referring to FIG. 1B next, there is formed an interlayer insulation film 26 of silicon oxide on the entire surface of the silicon substrate 21 by a plasma CVD process so as to cover the gate electrode 16 and the sidewall insulation films 20.

Further, with reference to FIG. 1B, there is formed a polishing stopper film 28 on the interlayer insulation film 26 with a film thickness of 50 nm. For the polishing stopper film 28, an SiC film formed by a plasma CVD process may be used. Further, it is also possible to use an SiN film formed by a plasma CVD process for this purpose. The polishing stopper film 28 functions as a stopper when polishing a tungsten film (not illustrated in FIG. 1B) by a chemical mechanical polishing process in the step to be explained later. It should be noted that the polishing stopper film 28 functions also as an etching stopper at the time of forming a trench in the interlayer insulation film in the step to be explained later.

Next, a contact hole 30 is formed in the interlayer insulation film 26 to reach the source/drain diffusion region 22 by a photolithographic technology and the structure of FIG. 1B is obtained as a result.

Figure 1C:
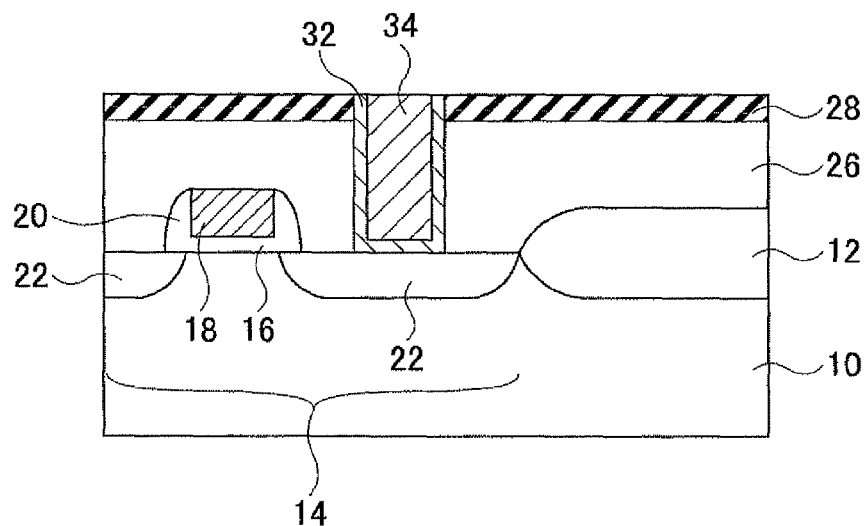

Next, in the step of FIG. 1C, an adhesion layer 32 of a TiN film is formed with a thickness of 50 nm by conducting a sputtering process to the entire surface of the structure of FIG. 1B. It should be noted that the adhesion layer 32 is provided for securing necessary adhesion to the conductive plug to be explained layer.

Further in the step of FIG. 1C, a tungsten film 34 is formed by a plasma CVD process on the entire surface of the structure of FIG. 1B with a film thickness of 1 μm to cover the adhesion layer 32, and the tungsten film 34 and the underlying adhesion layer 32 are polished by a CMP process until the surface of the polishing stopper 28 is exposed. As a result, there is obtained a structure represented in FIG. 1C such that a conductive plug 34 of tungsten is embedded into the contact hole 30.

Figure 1D:
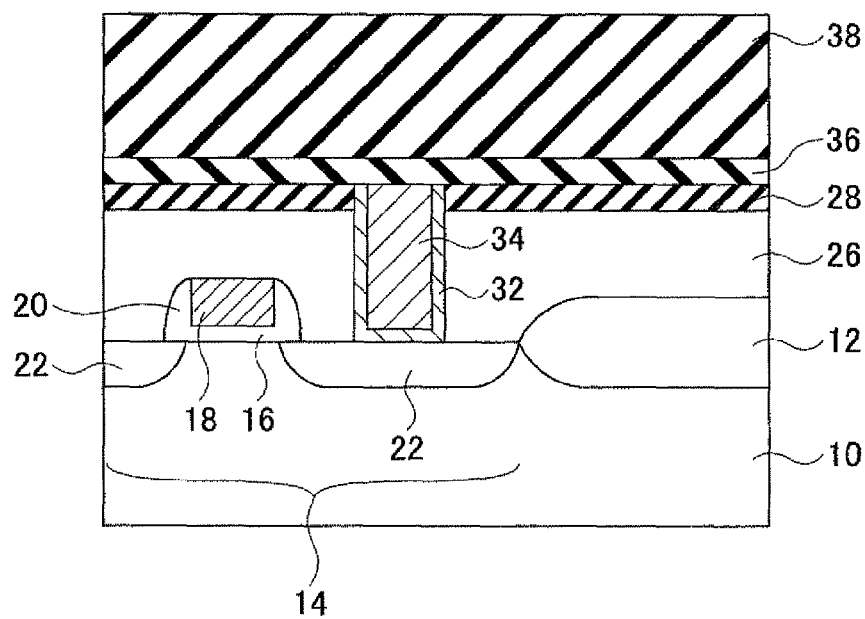

Next, in the step of FIG. 1D, an insulating diffusion barrier film 36, which is an insulation film capable of functioning as a diffusion barrier such as an SiC film, is formed on the structure of FIG. 1C by a plasma CVD process with a film thickness of about 30 nm, and an interlayer insulation film 38 is formed further thereon. Here, it should be noted that the insulating diffusion barrier film 36 is not limited to an SiC film and it is also possible to use an SiN film for this purpose. For the interlayer insulation film 38, it is possible to use porous silica (a porous silica film), while the present embodiment is not limited to such a specific material, and it is also possible to use an organosiloxane film or hydrogenated siloxane film that contains Si as a component or a porous film thereof for this purpose. Further, it is possible to use an organic polymer film as long as the film contains Si therein. For such an interlayer insulation film, it is also possible to use various materials marketed under various trade names such as: NCS (JGC Catalysis and Chemicals Ltd.); IPS (JGC Catalysis and Chemicals Ltd.); Black Diamond (Applied Materials, Inc.); CORAL (Novellus Systems, Inc.); LKD series (JSR Corporation); AUROLA (ASM International N.V.); HSG series (Hitachi Chemical Co., Ltd.); Nanoglass (Honeywell International Inc.); Z3MS (Dow Corning Corporation); XLK (Dow Corning Corporation); Orion (Trikon Technologies Inc.), and the like. The foregoing porous interlayer insulation film 38 may be formed with a film thickness of 160 nm, for example. Depending on the material, the interlayer insulation film 38 may be formed by a spin-coating process or plasma CVD process.

Figure 1E:
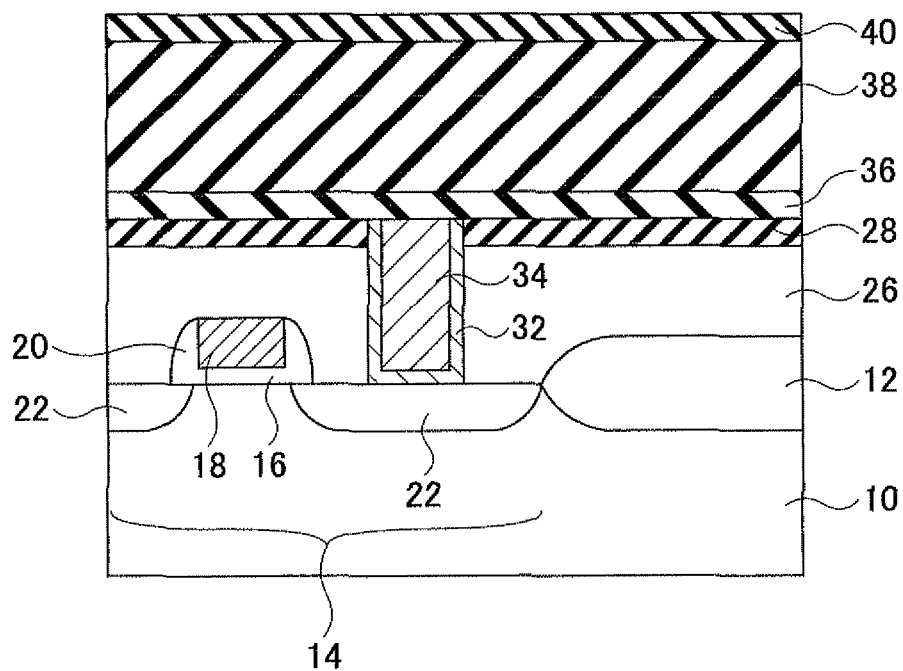
Figure 1F:
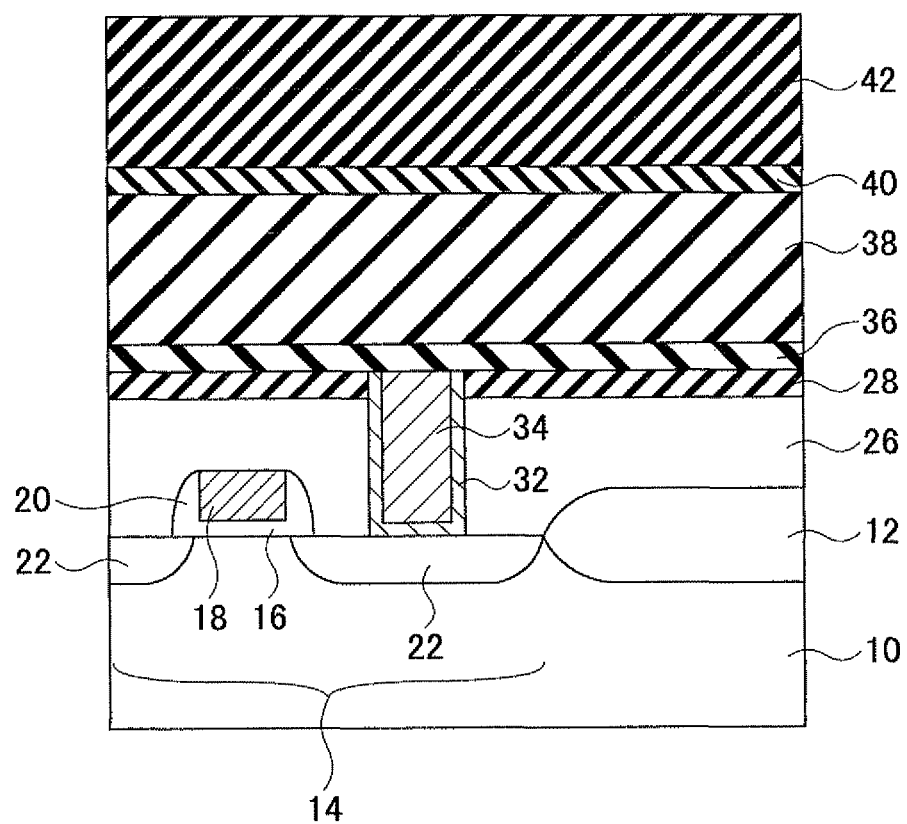

Next, in the step of FIG. 1E, an insulating diffusion barrier film 40 similar to the insulating diffusion barrier film 36 is formed by a CVD process with a thickness of 30 nm, for example, and a photoresist film 42 is formed in the step of FIG. 1F to cover the entire surface of the insulating diffusion barrier film 40.

Figure 1G:
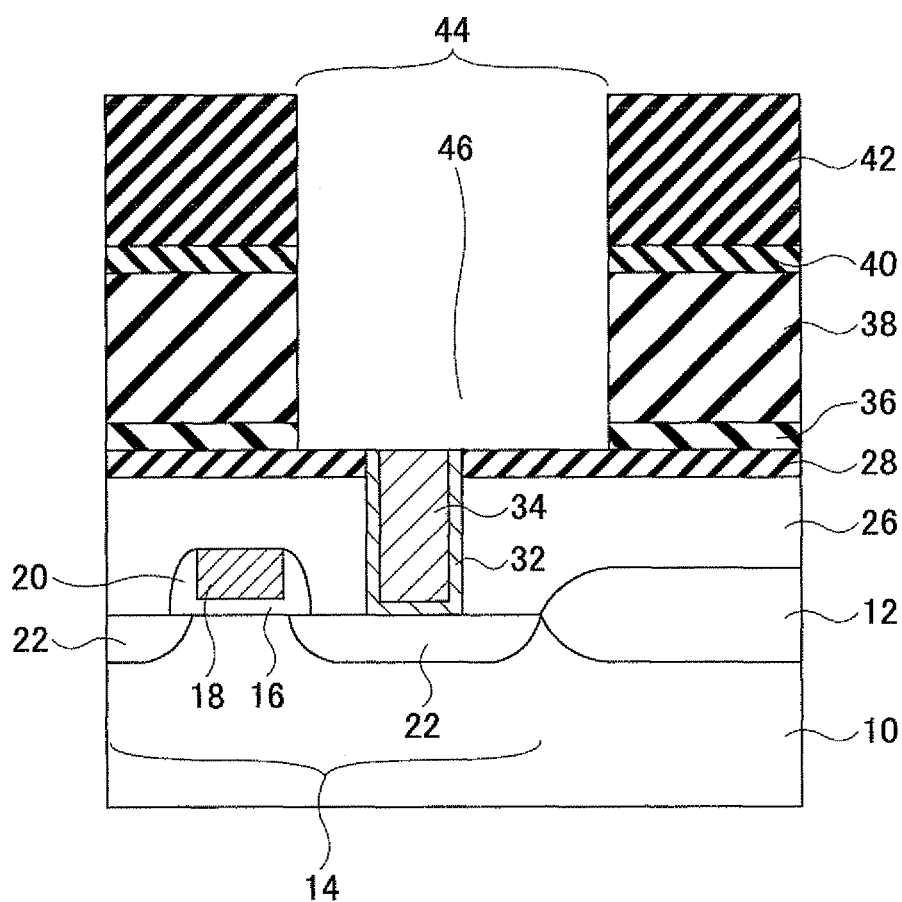

Further, in the step of FIG. 1G, a resist opening 44 is formed in the photoresist film 42 by photolithography, and the insulating diffusion barrier film 40, the interlayer insulation film 38 and the insulating diffusion barrier film 36 are etched consecutively while using the photoresist film 42 as a mask. As a result, there is formed an opening 46 in the interlayer insulation film 38 in correspondence to the resist opening 44. The opening 46 is an opening for forming a first layer interconnection pattern (first metal interconnection layer) 50 and is formed to have an interconnection pattern width of 100 nm and an interconnection pattern spacing of 100 nm, for example.

In FIG. 1G, the etching process is conducted typically by a plasma etching process while using a CF-based gas containing fluorine such as a $CF_4$ gas and a $CHF_3$ gas, a $CH_2F_2$ gas, a $C_4F_6$ gas, a $C_4F_8$ gas, a $C_5F_8$ gas, a $CF_3I$ gas, and the like, as an etching gas. Further, the etching process is conducted while using the stopper film 28 as an etching stopper. As a result of the process of FIG. 1G, the opening 46 is formed in the insulation film 40, the interlayer insulation film 38 and the insulating diffusion barrier film 326 for embedding the interconnection pattern such that the top surface of the conductive plug 34 is exposed in the opening 46. Thereafter, the photoresist film 42 is removed.

Meanwhile, in the step of FIG. 1G, there can be a case in which the molecules of the etching gas are adsorbed and remain on the sidewall surfaces and the bottom surface of the opening 46 after the etching of the opening 46. Because the etching is conducted while using an etching gas that contains fluorine (F), it should be noted that the sidewall surfaces and the bottom surface of the opening 46 are terminated with fluorine. Thus, there are formed Si—F bonds on the sidewall surfaces and the bottom surface of the opening 46 when the interlayer insulation film 38 or the insulating diffusion barrier films 36 and 40 contain silicon (Si) as a component.

Now, when there remains water on the sidewall surfaces or bottom surface of the opening 46 and these surfaces are then covered with a barrier metal film, the foregoing Si—F bonds on the surface cause a reaction

$$\equiv\text{SiF} + H_2O \rightarrow \equiv\text{Si—OH} + HF \qquad (1),$$

wherein there arises a concern that HF thus formed works as a catalyst and causes oxidation in the barrier metal film formed subsequently. Here, it should be noted that the designation "≡Si" denotes that the Si atom causes bonding with other atom or atoms such as oxygen in the interlayer insulation film. It should be noted that the water thus remains on the sidewall surfaces or bottom surface of the opening 46 originates from the water or hydrogen adsorbed to the interlayer insulation film 38.

Water or fluorine remaining in the etching opening 46 can be removed by exposure to plasma, and thus, it has been practiced in the art that such water or fluorine has been removed by plasma processing. However, as noted previously, plasma processing causes damages in the interlayer insulation film and resultant increase of water absorbability of the interlayer insulation film tends to invite the problems such as increase of the specific dielectric constant of the interlayer insulation film formed of a low-K dielectric.

Thus, the present embodiment proposes to remove the CF-based etching gas molecules and terminating fluorine remaining on the bottom surface and sidewall surfaces of the opening 46, the opening 46 being formed in the interlayer insulation film 38 by using a fluorine-based etching gas, while using a superheated steam.

Figure 2A:
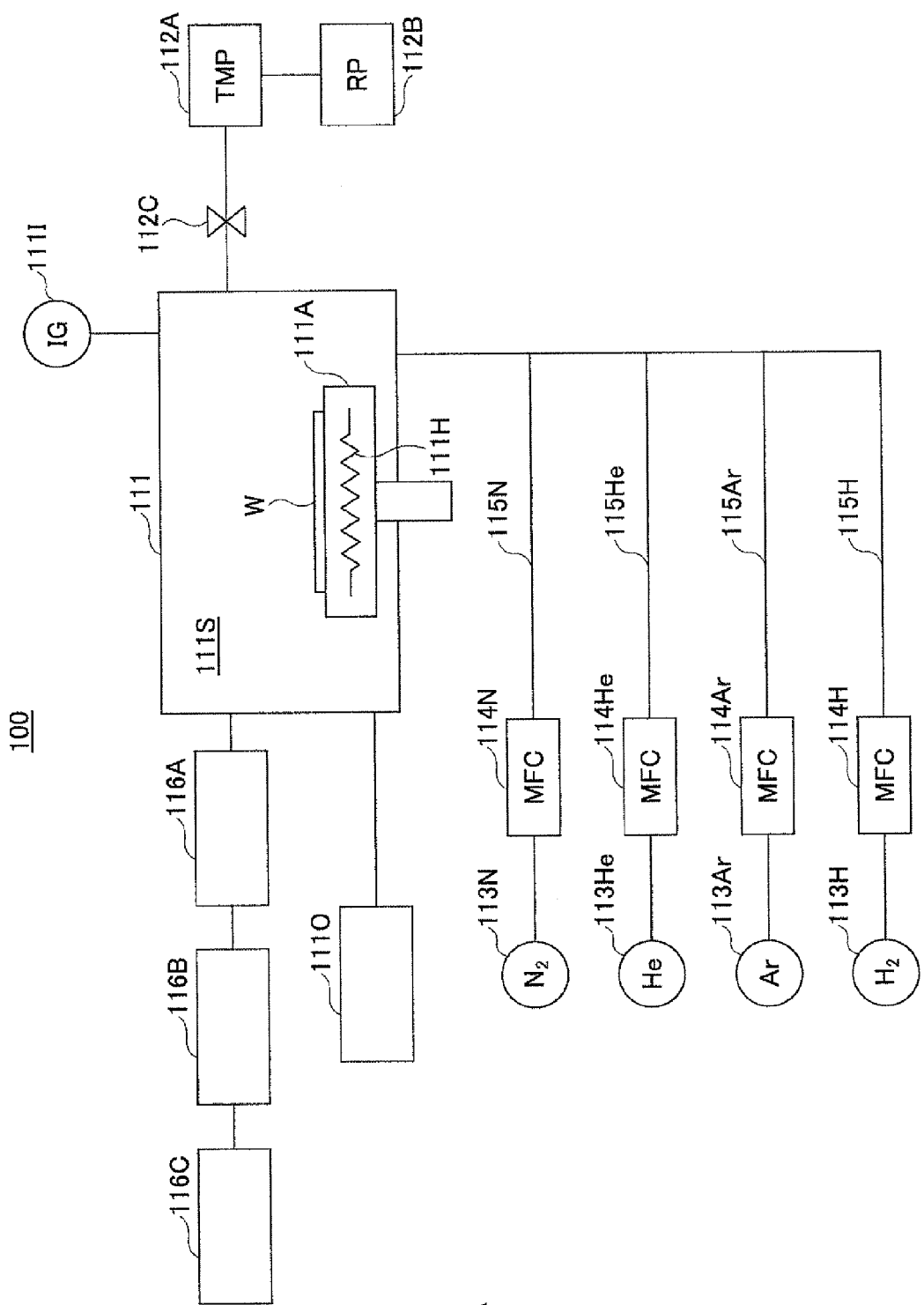
FIG. 2A is a diagram representing an outline of a substrate processing apparatus used with the first embodiment.
Figure 3:
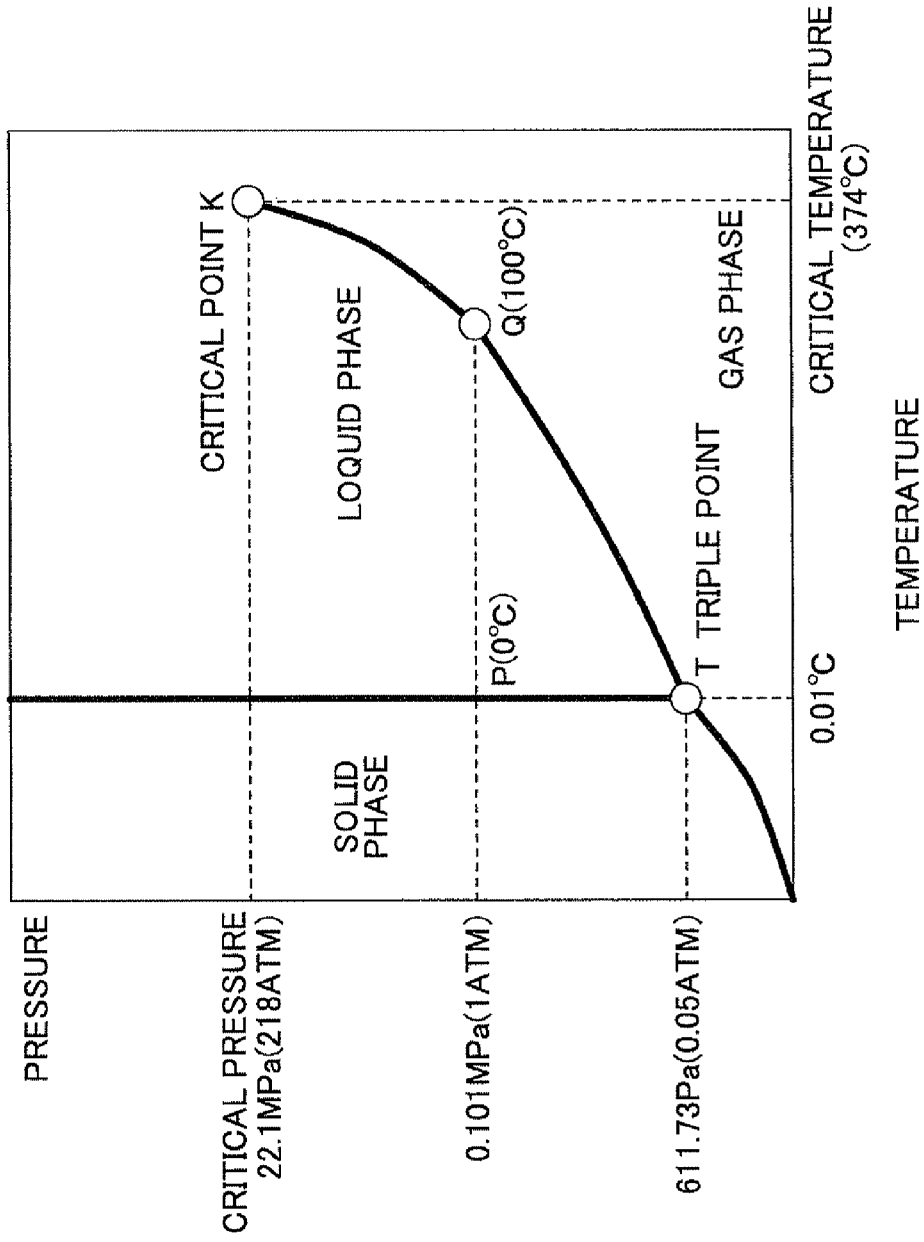
FIG. 3 is a phase diagram of water.
Figure 4:
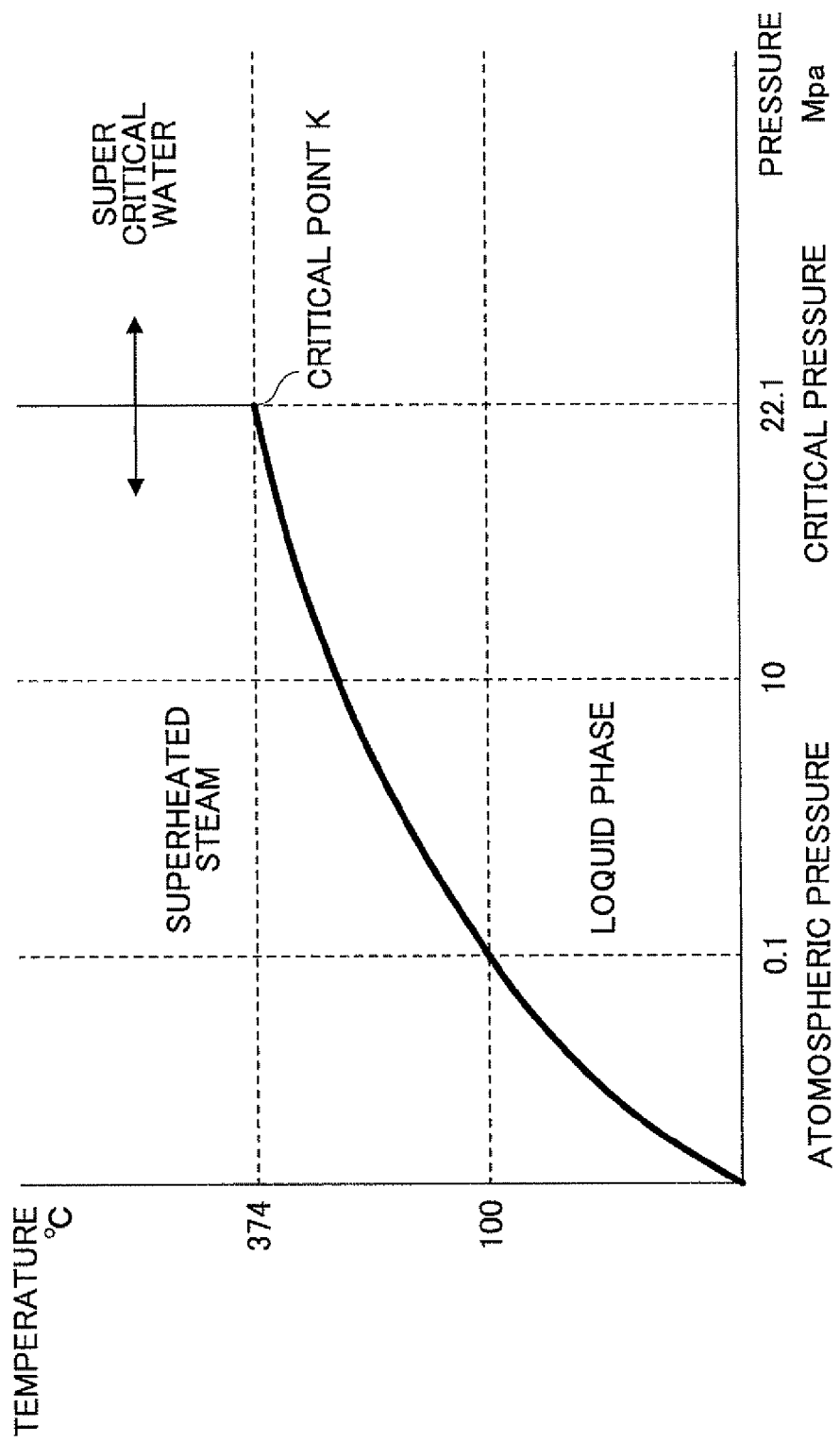
FIG. 4 is a phase diagram representing a neighborhood of a critical point in the phase diagram of FIG. 3 in detail.

FIG. 2A represents the outline of a substrate processing used with the first embodiment for the processing by the superheated steam while FIGS. 3 and 4 represent a phase diagram of the superheated steam.

Referring to FIG. 2A, a substrate processing apparatus 100 includes a processing vessel 111 evacuated by a turbo molecular pump 112A and a rotary pump 112B via a valve 112C, wherein the processing vessel accommodates therein a stage 111A for holding a substrate W to be processed. The stage 111A is equipped with a heating mechanism 111H such as a resistance heater. Further, the processing vessel 111 is provided with an ion gauge 111I for measuring a pressure or degree of vacuum of a processing space 111S inside the processing vessel 111 and further with an oxygen concentration level meter 111O for measuring the oxygen concentration level of the processing space 111S.

Further, the substrate processing apparatus 110 includes a first gas supply line 115N for supplying a nitrogen gas from a nitrogen gas source 113N to the processing vessel 111 via a corresponding MFC (mass flow controller) 114N, a second gas supply line 115He for supplying a helium gas from a helium gas source 113He to the processing vessel 111 via a corresponding MFC (mass flow controller) 114He, a third gas supply line 115Ar for supplying an argon gas from an argon gas source 113Ar to the processing vessel 111 via a corresponding MFC (mass flow controller) 114Ar, and further a fourth gas supply line 115H for supplying a hydrogen gas from a hydrogen gas source 113H to the processing vessel 111 via a corresponding MFC (mass flow controller) 114H.

Further, the substrate processing apparatus 110 includes a superheated steam generator 116A supplying a superheated steam into the processing vessel 111, wherein the superheated steam generator is supplied with a liquid water from a water tank 116C via a water pump 116B.

FIG. 2B is a cross-sectional diagram representing a schematic structure of the superheated steam generator 116A.

Figure 6A:
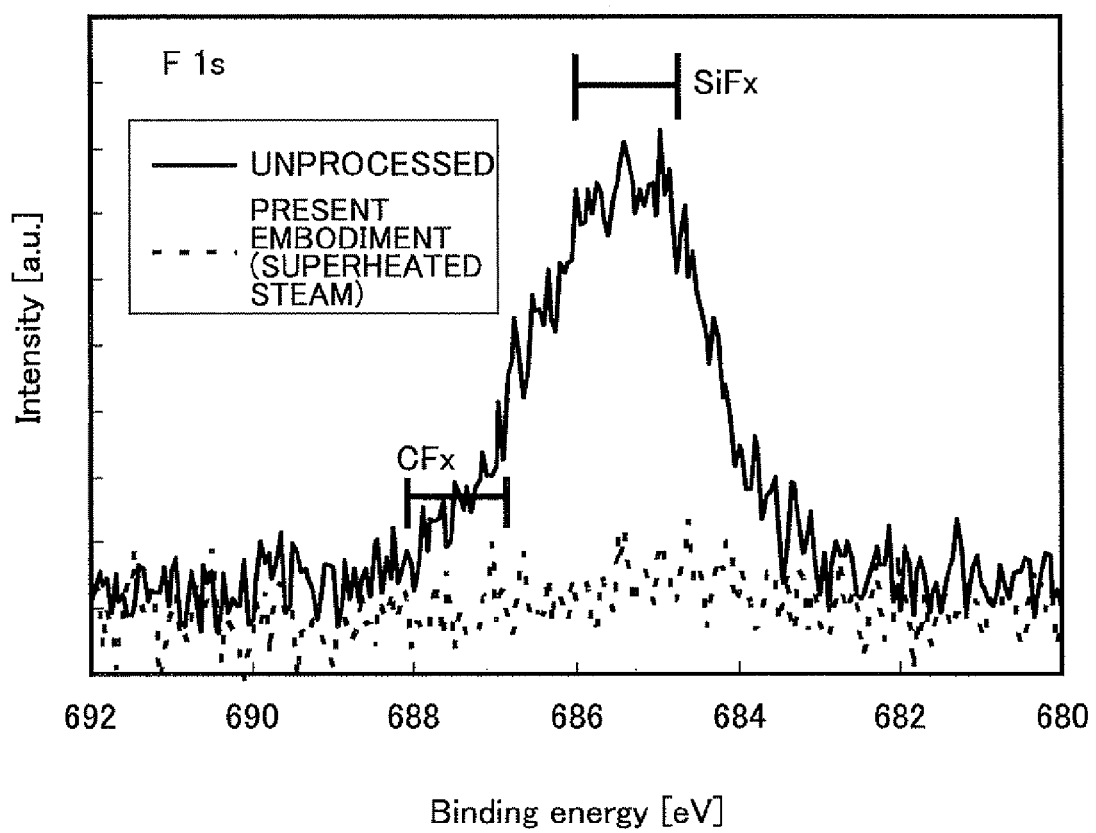
FIG. 6A is an XPS spectrum diagram representing the effect of removal of $SiF_x$ by the superheated steam.
Figure 6B:
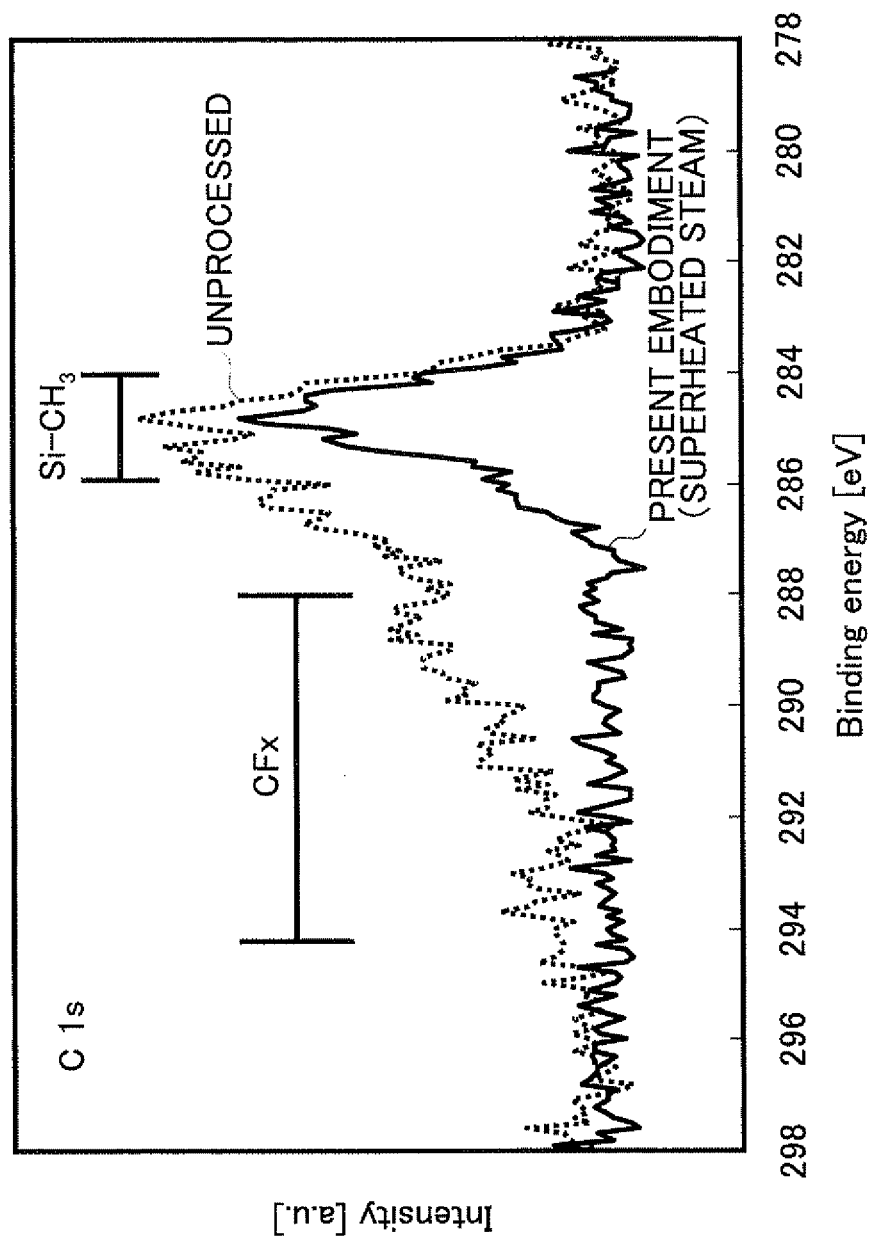
FIG. 6B is an XPS spectrum diagram representing the effect of removal of $CF_x$ by the superheated steam.

Referring to FIG. 6B, the superheated steam generator 116A includes an electric furnace 116H equipped with a heater 116h and generates the desired superheated steam by supplying water through a conduit 116Q of quartz or stainless steel inserted into the electric furnace 116H.

FIG. 3 is a phase diagram of water and represents a triple point T and a critical point K. In FIG. 3, a vertical axis represents a pressure and a horizontal axis represents a temperature.

The triple point T is a point in which the solid phase water, and thus ice, the liquid phase water and further the gas phase water, and thus a steam, coexist. The triple point T is fixed to a pressure of 611.71 Pa and a temperature of 0.01° C. On the other hand, the critical point K is a point located on a phase boundary between the liquid phase water and the gas phase water, wherein the distinction between the liquid phase and the gas phase disappears when the temperature or pressure is increased beyond the critical point K. The temperature of the critical point K, and thus a critical temperature, is 374° C., while the pressure of the critical point K, and thus a critical pressure, is 22.1 MPa.

FIG. 4 is a phase diagram representing the state of water in the vicinity of the critical pint K in more detail. In the illustration of FIG. 4, it should be noted that the vertical axis represents the temperature and the horizontal axis represents the pressure.

Referring to FIG. 4, the water becomes "supercritical water" when the temperature and pressure is increased beyond the critical point K. In the region below the critical pressure, the gas phase water, and thus a steam, becomes "heated steam" or "superheated steam".

Table 1 below summarizes various physical properties (dielectric constant, density, kinetic viscosity, effective diffusion coefficient) of ordinary temperature water at 0.1 MPa and 25° C., supercritical water at 27.6 MPa and 450° C. and superheated steam at 1.38 MPa and 450° C.

TABLE 1

| FLUID | ordinary temperature water | supercritical water | superheated steam |
|---|---|---|---|
| Temperature (° C.) | 25 | 450 | 450 |
| Pressure (MPa) | 0.1 | 27.6 | 1.38 |
| Dielectric Constant | 78 | 1.8 | 1 |
| Density (g/cm$^3$) | 0.998 | 0.128 | $4.19 \times 10^{-3}$ |
| kinetic viscosity (m$^2$/sec) | $8.92 \times 10^{-7}$ | $2.33 \times 10^{-7}$ | $6.32 \times 10^{-6}$ |
| effective diffusion coefficient (cm$^2$/sec) | $7.74 \times 10^{-6}$ | $7.67 \times 10^{-4}$ | $1.79 \times 10^{-3}$ |

Referring to Table 1, it can be seen that the superheated steam has the feature of low density of $4.19 \times 10^{-3}$ g/cm$^3$, which is lower than the density of the ordinary temperature water or the supercritical water, and further has the feature of small kinetic viscosity of $6.32 \times 10^{-6}$ m$^2$/sec, which is smaller than that of the ordinary temperature water or the supercritical water by the factor of 10. Further, the superheated steam has an effective diffusion coefficient of $1.79 \times 10^{-3}$ cm$^2$/sec, which is smaller than that of the ordinary temperature water or supercritical water. Further, the superheated steam has a feature in relation to the value of specific dielectric constant that the superheated steam has a specific dielectric constant of almost 1.0, which is smaller than that of the ordinary temperature water or the supercritical water. The foregoing fact indicates that the superheated steam is substantially non-polar in nature contrary to the ordinary temperature water.

Figure 5:
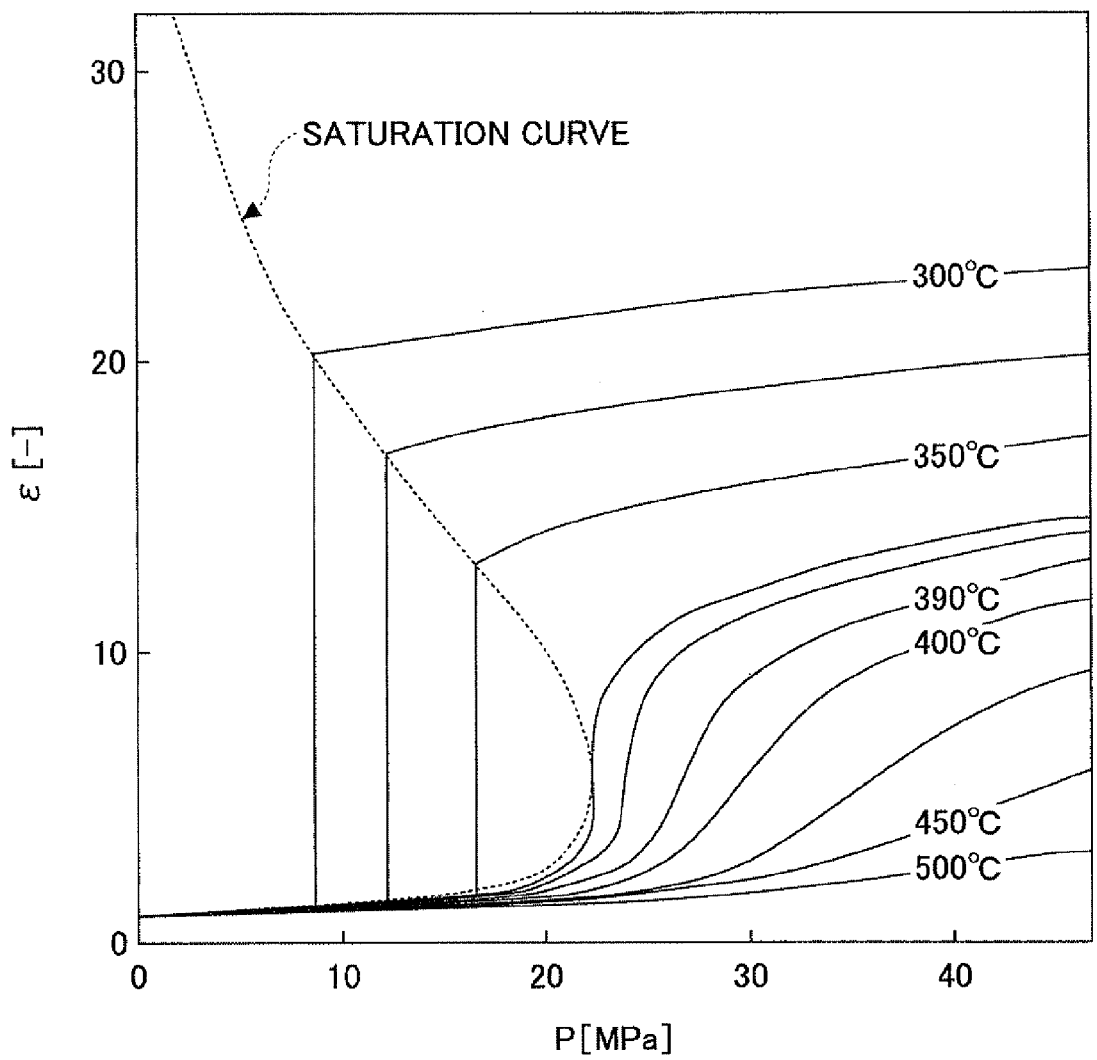
FIG. 5 is a diagram representing a relationship between the temperature, pressure and specific dielectric constant of a superheated steam.

FIG. 5 is a graph representing the relationship between the dielectric constant, the pressure and the temperature for water. In FIG. 5, the vertical axis represents the dielectric constant while the horizontal axis represents the pressure.

Referring to FIG. 5, it can be seen that the superheated steam becomes substantially non-polar at the temperature of 300° C.-500° C. under the pressure of 10 Pa or lower as can be seen from the specific dielectric constant of almost 1.0. In FIG. 5, it should be noted that "saturation curve" represents the two-phase separation state of steam and water. FIG. 5 thus indicates that this two-phase separation state disappears at the critical point K located at the temperature of 374° C. and the pressure of 22.1 MPa.

Figure 1H:
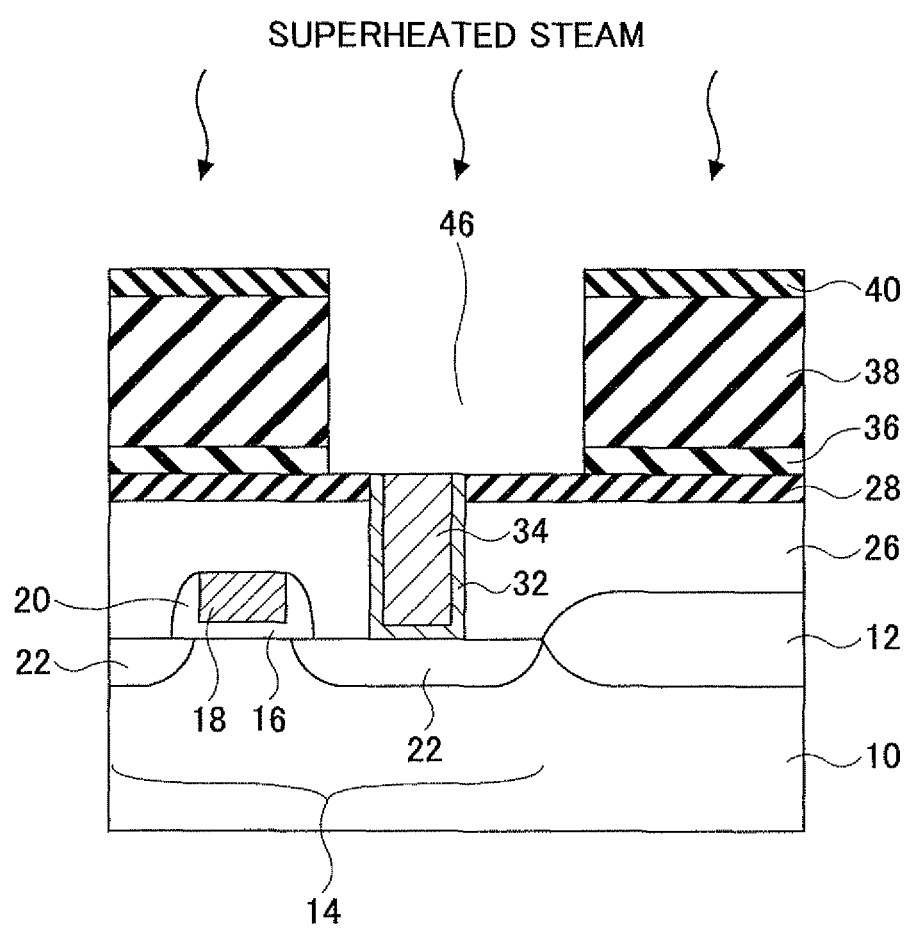

Thus, the present embodiment employs the substrate processing apparatus 100 of FIG. 2A in the cleaning process of FIG. 1H to remove the CF$_x$ molecules or the terminating fluorine originating from the etching gas and adsorbed to the bottom surface and sidewall surfaces of the opening 46, by carrying out the cleaning process while using the superheated steam. Such non-polar water vapor of the specific dielectric constant of 1.0 is effective for decoupling the non-polar residual CF$_x$ molecules adsorbed to the bottom surface or sidewall surfaces and further to decouple the terminating fluorine according to the reaction of the formula (1) and remove in the form of HF. The HF thus formed is immediately removed away from the processing space 111S and does not dwell in the processing space 111S anymore as the processing space 111S is evacuated by the turbo molecular pump 112A and the rotary pump 112B.

More specifically, the structure of FIG. 1G is introduced into the processing vessel 111 of the substrate processing apparatus 100 of FIG. 2A after the removal of the resist film 42 as the substrate W and is placed upon the stage 111A.

Next, the liquid water in the water tank 116 is supplied to the superheated steam generator 116A by the water pump 116B for generation of the superheated steam. The superheated steam thus generated is supplied to the processing vessel 111 under the pressure of 0.1 MPa (ordinary pressure) at the temperature of 250° C., for example. Thereby, it is advantageous to heat the water supplied from the water pump 116B, in the superheated steam generator 116A, to a temperature higher than the desired temperature by 50° C. in anticipation of the dilatational cooling effect in the processing space 111S. Further, the heating mechanism 111H of the stage 111A is activated to maintain the temperature of the substrate W to 250° C. for avoiding the temperature drop of the superheated steam.

Figure 6C:
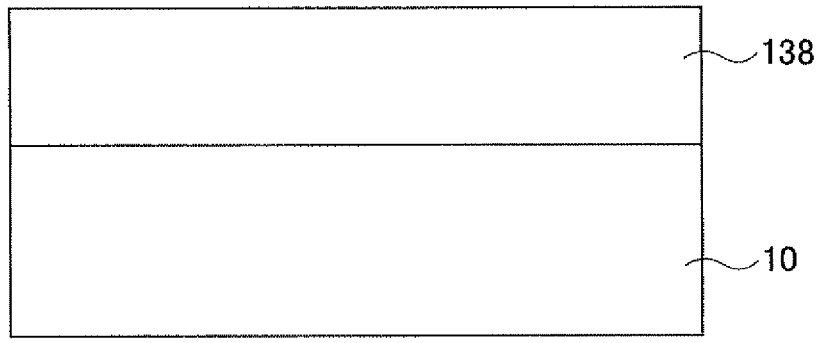
FIG. 6C is a cross-sectional diagram representing a specimen used for the XPS spectrum measurement in FIGS. 6A and 6B.
Figure 6D:
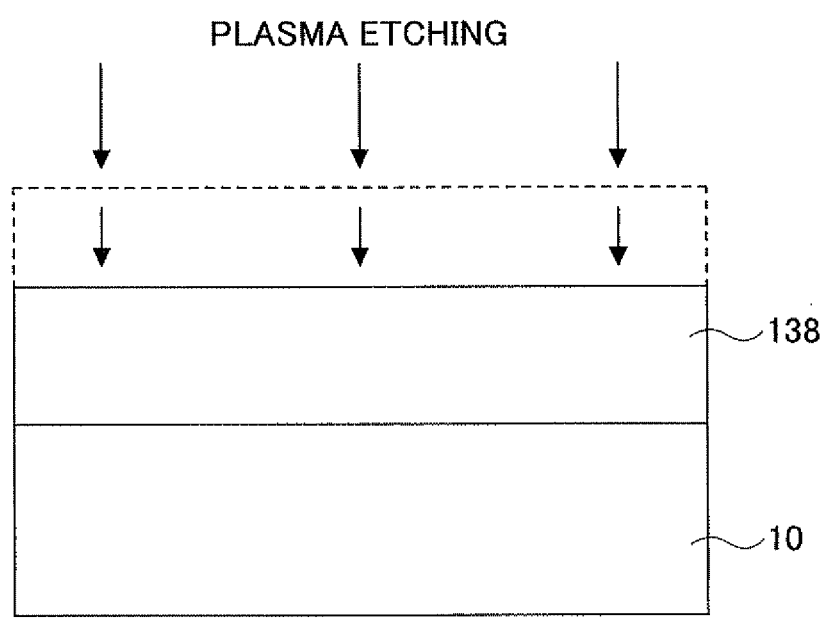
FIGS. 6D and 6E are diagrams representing a process of preparing the specimen of FIG. 6C.
Figure 6E:
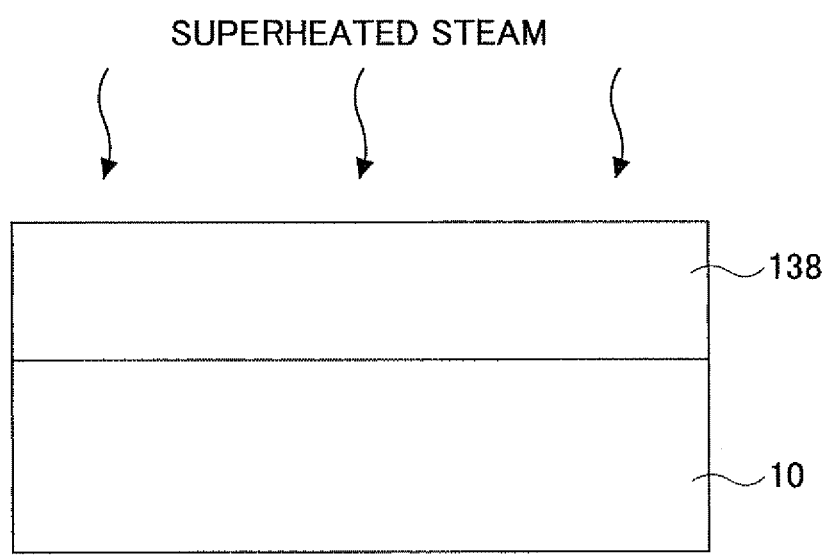

FIGS. 6A and 6B represents the results of XPS (X-ray photoelectron spectroscopy) analysis conducted for verifying the effect of removal of fluorine and carbon by the superheated steam. In the analysis of FIGS. 6A and 6B, it should be noted that the XPS spectrum is obtained for the specimen after the dry etching process of FIG. 1G that uses the CF-based dry etching gas for the case in which the cleaning process of FIG. 1H by the superheated steam is not yet applied (designated as "UNPROCESSED") and for the case in which the cleaning process is applied (designated as "PRESENT EMBODIMENT (SUPERHEATED STEAM)"). Actually, the XPS measurements of FIGS. 6A and 6B are conducted not to the specimen of FIG. 1H itself but to a flat specimen represented in FIG. 6C. It should be noted that the specimen of FIG. 6C is obtained by applying a superheated steam process similar to that of FIG. 1H as represented in FIG. 6E for a structure obtained by forming an interlayer insulation film 138 corresponding to the interlayer insulation film 38 on the silicon substrate 10 as represented in FIG. 6D with a thickness of 150 nm in correspondence to the step of FIG. 1D and the plasma etching is applied subsequently to the interlayer insulation film 138 while using the $CF_4$ gas for the etching gas with a depth of about 30 nm.

Referring to FIG. 6A, the vertical axis represents the photoelectron intensity and the horizontal axis represents the binding energy of the F1s orbital, wherein it can be seen that the high $SiF_x$ peak observed before the cleaning process is no longer detected after the cleaning process. Likewise, it can be seen that the peak for $CF_x$ falls to the background level after the cleaning process.

Further, with reference to FIG. 6B, it can be seen that the $CF_x$ peak falls to the background level as compared with the state before the cleaning also at the binding energy corresponding to the C1s orbital, indicating that the $CF_x$ molecules are similarly removed by the cleaning.

In the step of FIG. 1H, it should be noted that the oxygen concentration level is suppressed to 0.6 volumetric % or less as will be explained later in detail. As a result, oxidation of the Cu interconnection layer exposed at the bottom of the opening 46 is suppressed. Further, oxidation of the barrier metal film 48 is also suppressed.

Figure 1I:
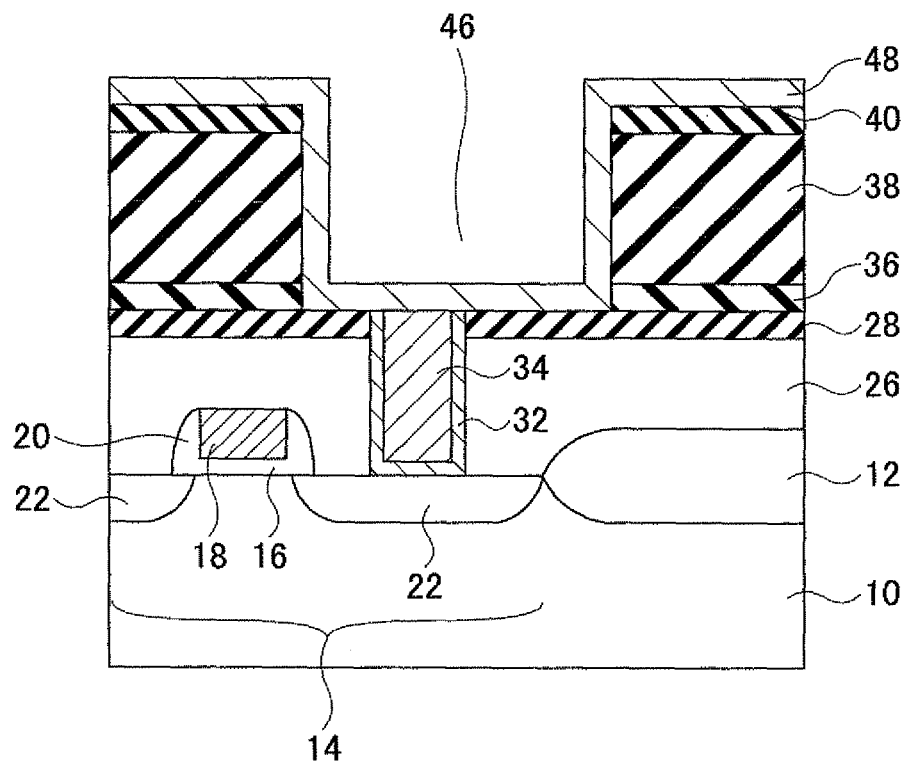

After the cleaning of the sidewall surfaces and bottom surface of the opening 46 in the step of FIG. 1H, a Ta film or a Ti film is formed over the entire surface of the structure of FIG. 1H in the step of FIG. 1I by a sputtering process, for example, with a thickness of 5 nm-30 nm, for example, such that the barrier metal 48 covers the surface of the diffusion barrier film 40 and the bottom surface and sidewall surfaces of the opening 46 continuously.

Figure 1J:
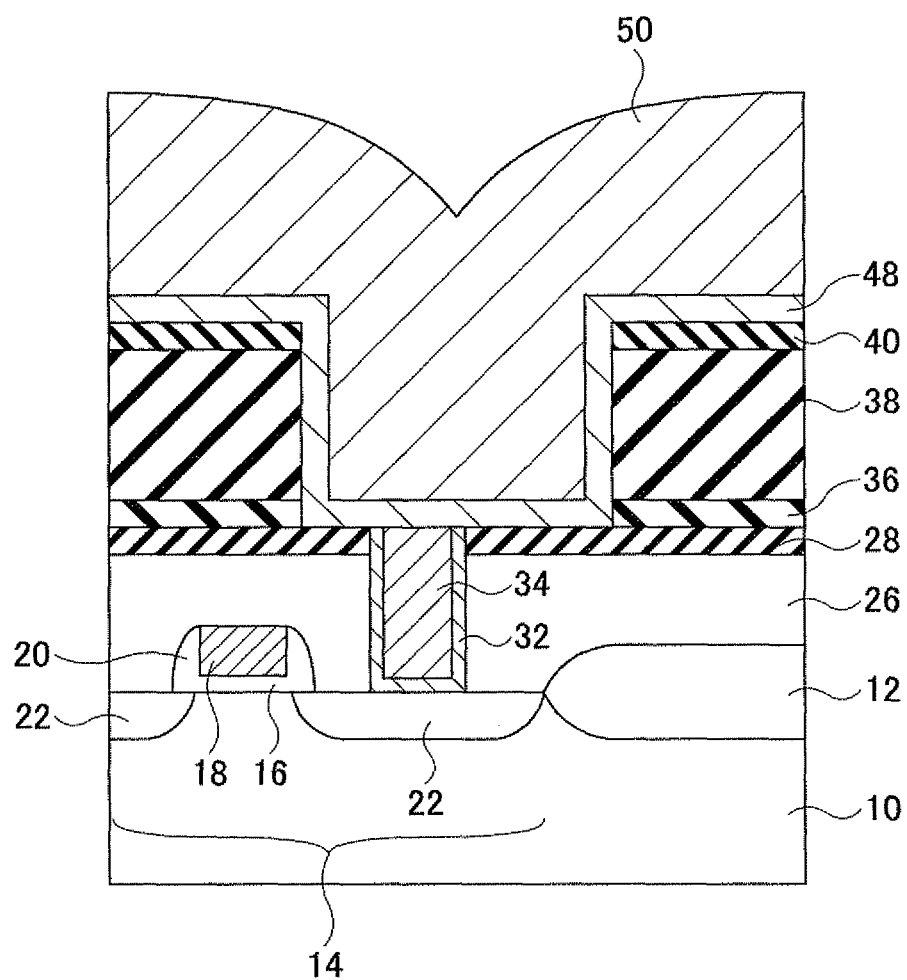

Next, in the step of FIG. 1J, a Cu seed layer (not illustrated) is formed over the entire surface of the structure of FIG. 1I by a sputtering process with a thickness of 10 nm, for example, so as to cover the barrier metal film 48, and a Cu film 50 is formed by an electrolytic plating process with a thickness of 600 nm, for example, so as to fill the opening 46 while using the Cu seed layer as an electrode.

Figure 1K:
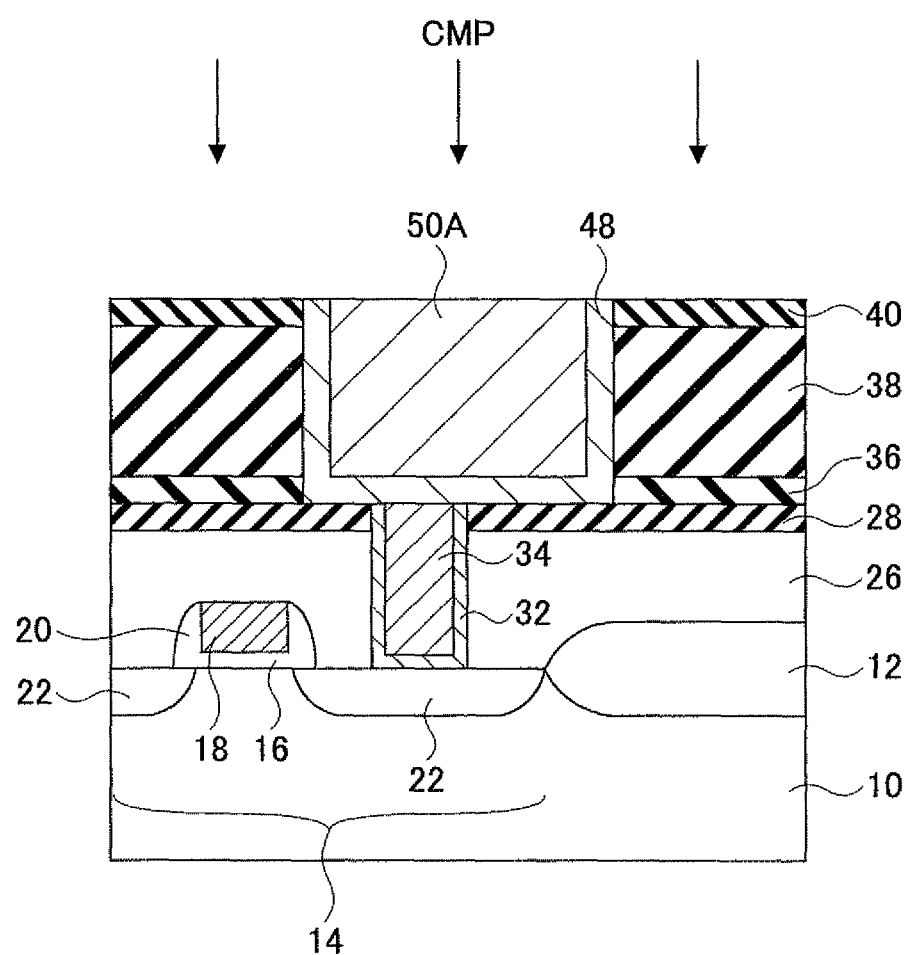

Further, in the step of FIG. 1K, a CMP process is conducted to polish the Cu film 50 and further the barrier metal film 48 until the surface of the insulating diffusion barrier film 40 is exposed. With this, there is formed an interconnection layer such that the Cu film 50 constitutes a Cu interconnection pattern 59A in the opening 46 and the Cu interconnection pattern 50A is embedded in the interlayer insulation film 38.

Figure 1L:
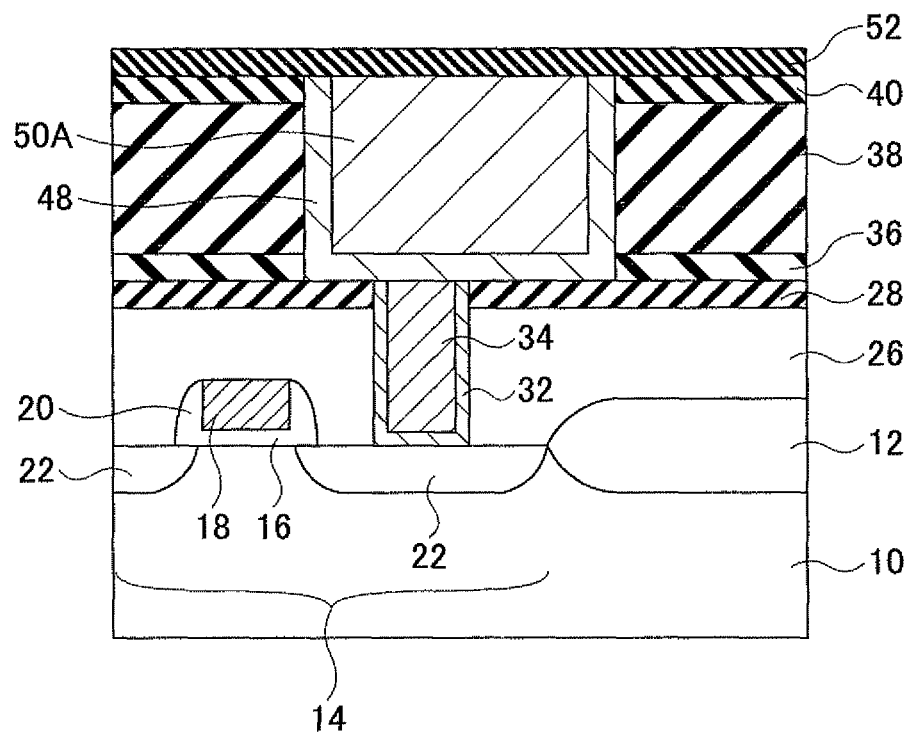
Figure 1M:
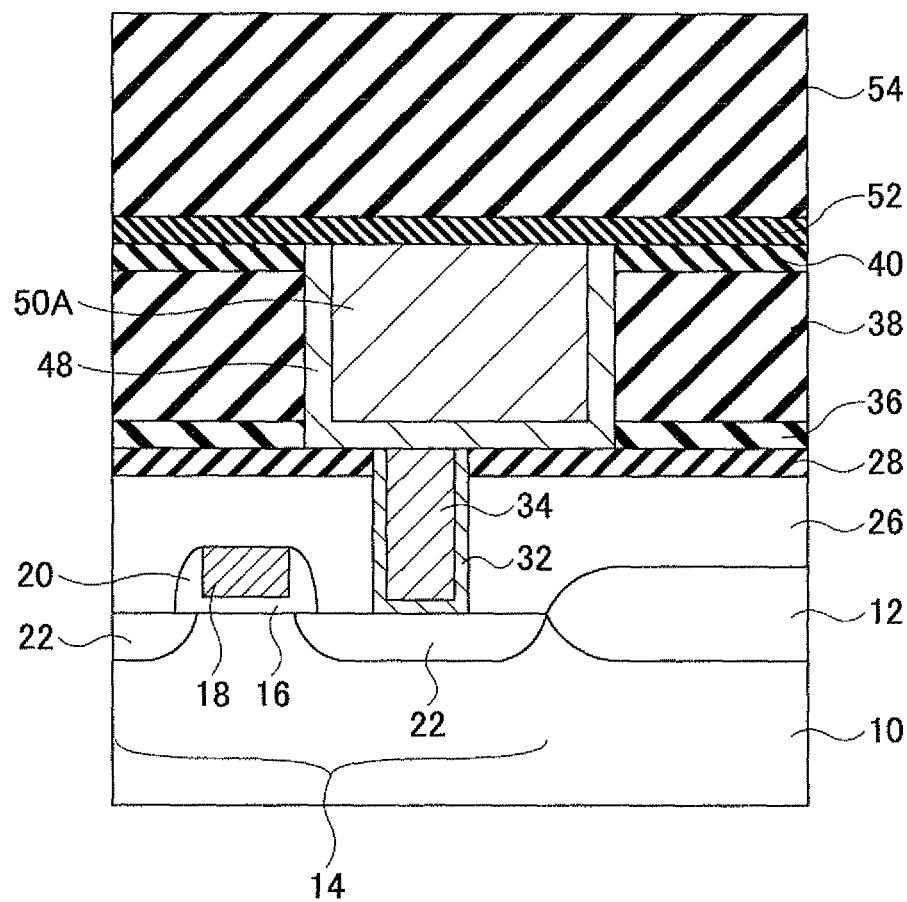
Figure 1N:
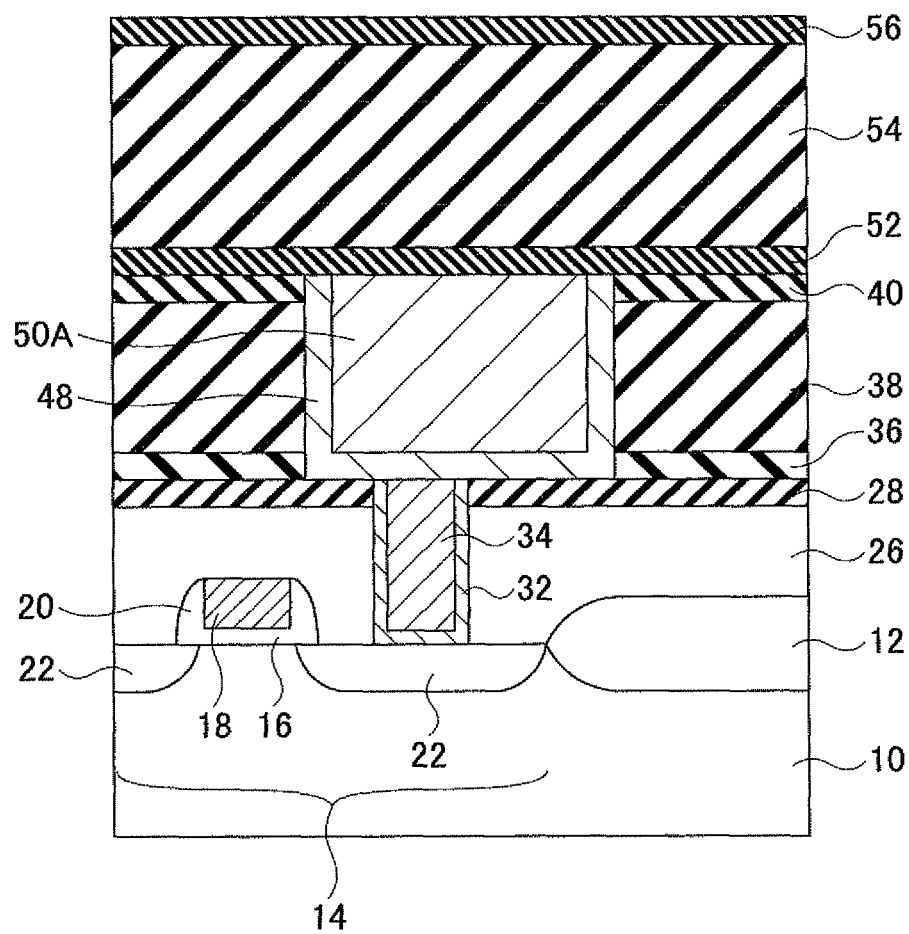

Next, in the step of FIG. 1L, there is formed an insulating diffusion barrier film 52 similar to the insulating diffusion barrier film 40 on the insulating diffusion barrier film 40 to cover the Cu interconnection pattern 50A by a plasma CVD process with a thickness of 30 nm, for example, and a porous interlayer insulation film 54 is formed in the step of FIG. 1M over the entire surface of the insulating diffusion barrier film 52 with a film thickness of 180 nm, for example. For the porous interlayer insulation film 54, it is possible to use an insulation film similar to the interlayer insulation film 38. Further, in the step of FIG. 1N, an insulating diffusion barrier film 56 similar to the insulating diffusion barrier film 52 is formed on the porous interlayer insulation film 54 by a plasma CVD process with a film thickness of 30 nm, for example.

Figure 10:
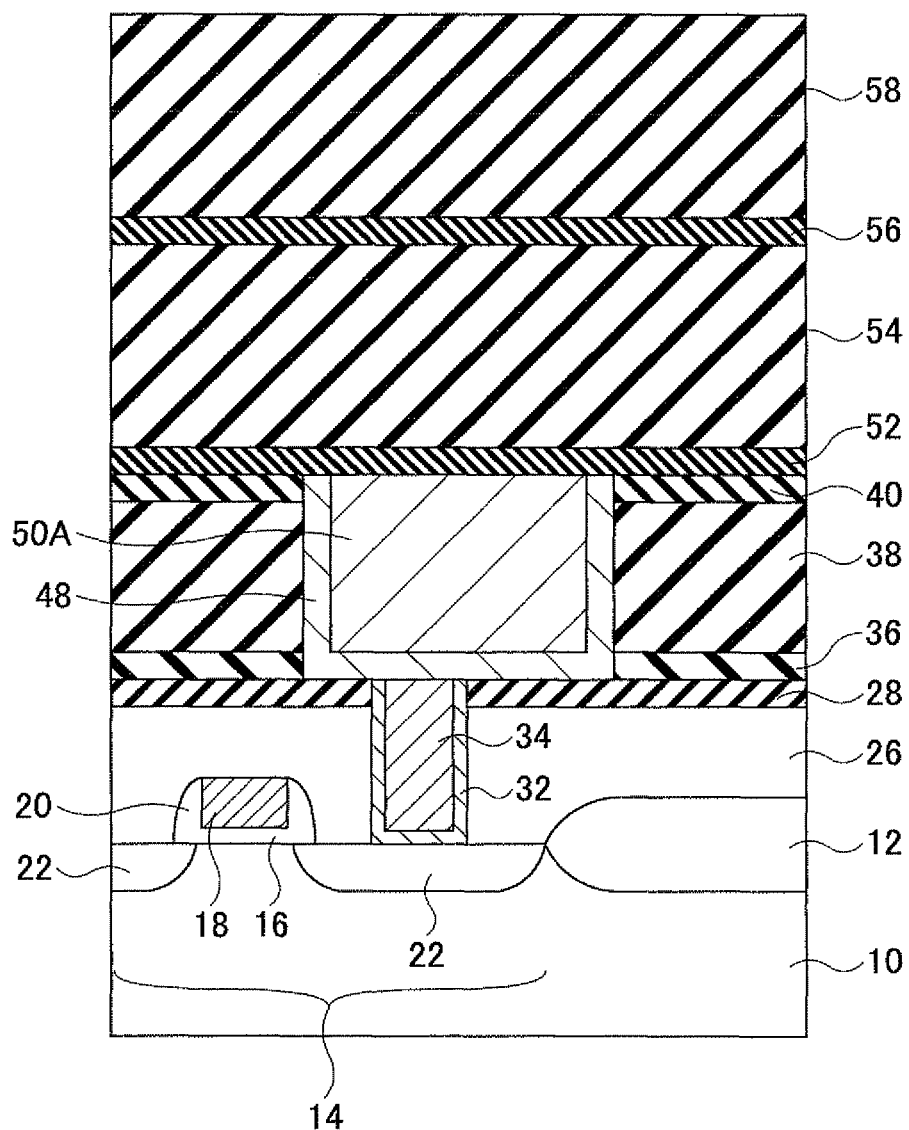
FIG. 10 is a flowchart representing an outline of the cleaning process that uses the superheated steam according to the second embodiment.
Figure 1P:
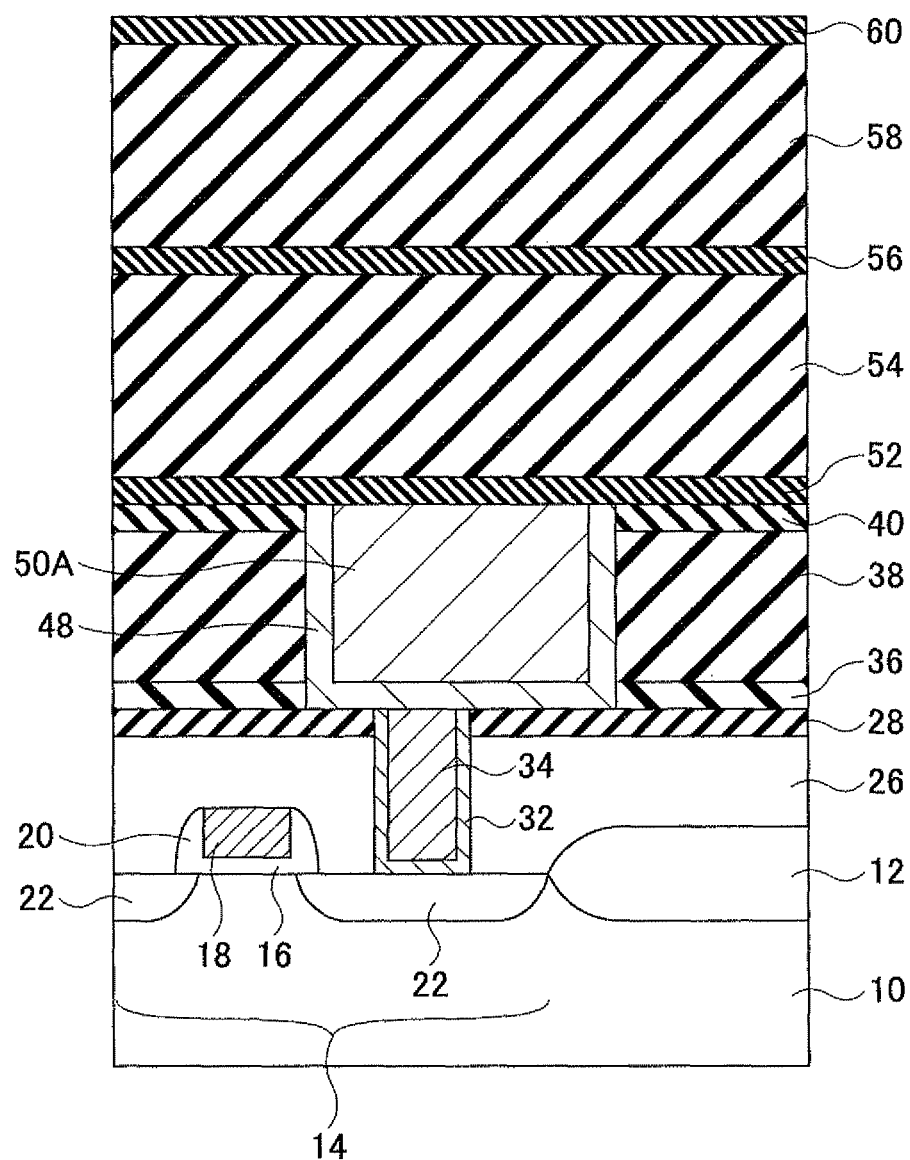

Next, as indicated in FIG. 10, a porous interlayer insulation film 58 similar to the porous interlayer insulation film 38 or 54 is formed on the insulating diffusion barrier film 56 with a film thickness of 160 nm, for example, and an insulating diffusion barrier film 60 is formed in the step of FIG. 1P on the porous interlayer insulation film 58 by a CVD process with a film thickness of 30 nm, for example.

Figure 1Q:
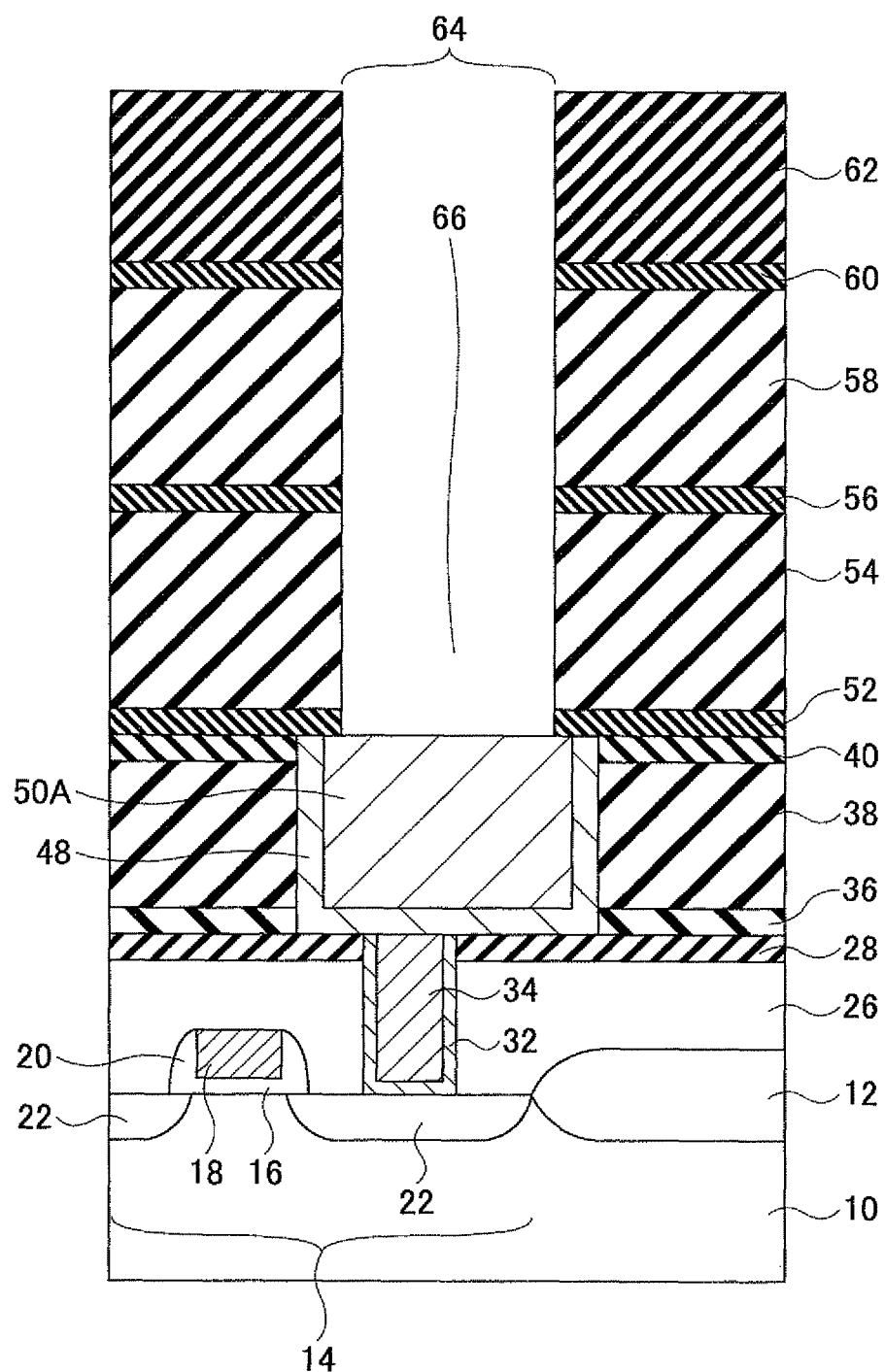

Further, in the step of FIG. 1Q, a photoresist film 62 is formed over the entire surface of the structure of FIG. 1P, wherein there is formed a resist opening 64 in the photoresist film 62 by patterning the photoresist film 62 by photolithography.

Further, in the step of FIG. 1Q, the insulating diffusion barrier film 60, the interlayer insulation film 58, the insulating diffusion barrier film 56, the interlayer insulation film 54 and the insulating diffusion barrier film 52 are etched while using the photoresist film 62 as a mask by a plasma etching process that uses a $CF_4$ gas and a $CHF_3$ gas as the etching gas. With this, there is formed a contact hole 66 exposing the Cu interconnection pattern 50A in correspondence to the resist opening 64.

Figure 1R:
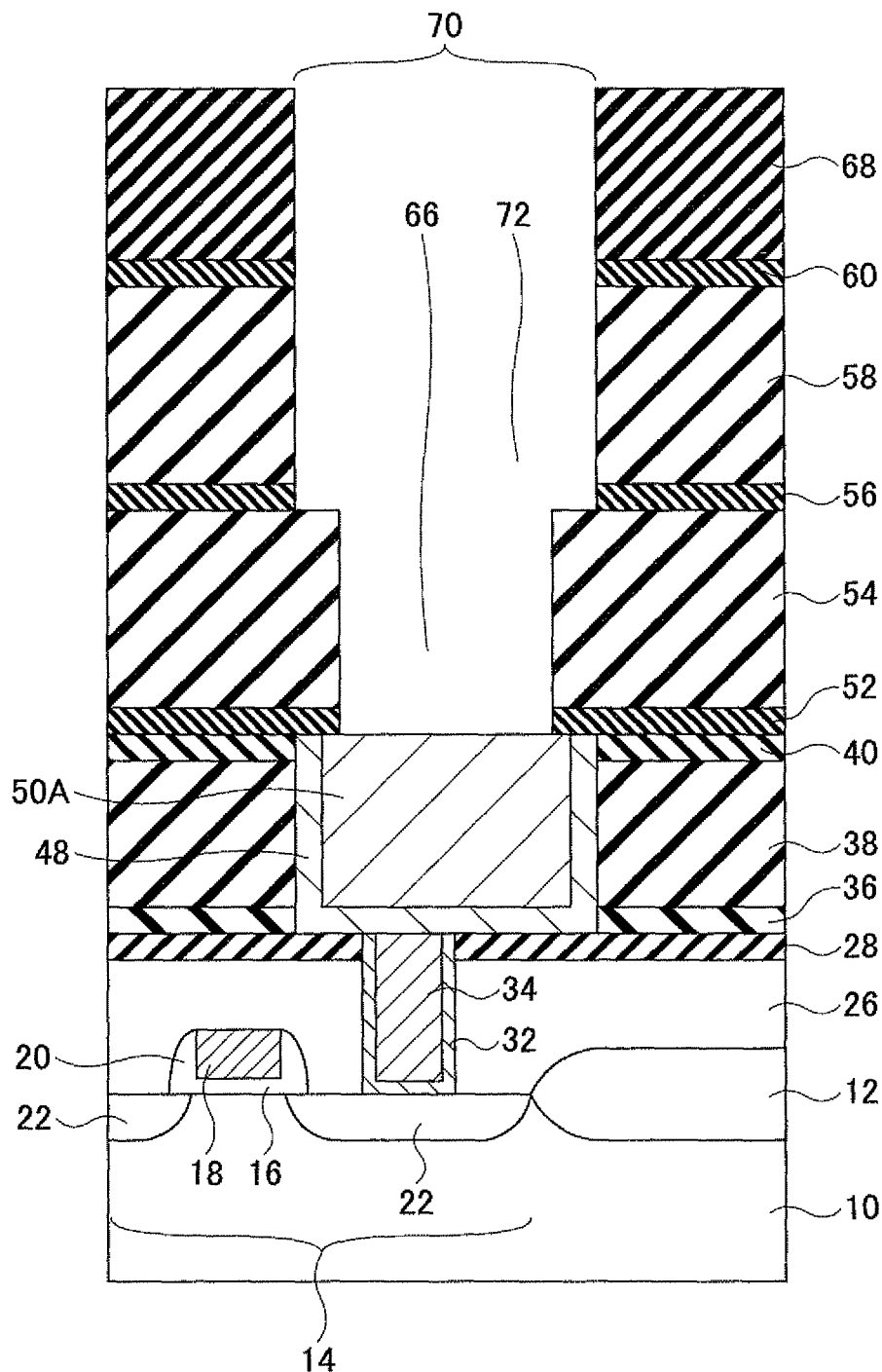

Further, the photoresist film 62 is removed and a photoresist film 68 is formed further in the step of FIG. 1R over the entire surface of the insulating diffusion barrier film 60.

Further, the photoresist film 69 is subjected to patterning by photolithography and there is formed a resist opening 70. Further, while using the photoresist film 68 as a mask, the insulating diffusion barrier film 60, the interlayer insulation film 58 and the insulating diffusion barrier film 56 are subjected to a plasma etching process that uses a $CF_4$ gas and a $CHF_3$ gas as an etching gas, and there is formed an interconnection trench 72 in the insulating diffusion barrier film 60, the interlayer insulation film 58 and the insulating diffusion barrier film 56 in correspondence to the resist opening 70 such that the interconnection trench 72 overlaps the contact hole 66.

Figure 1S:
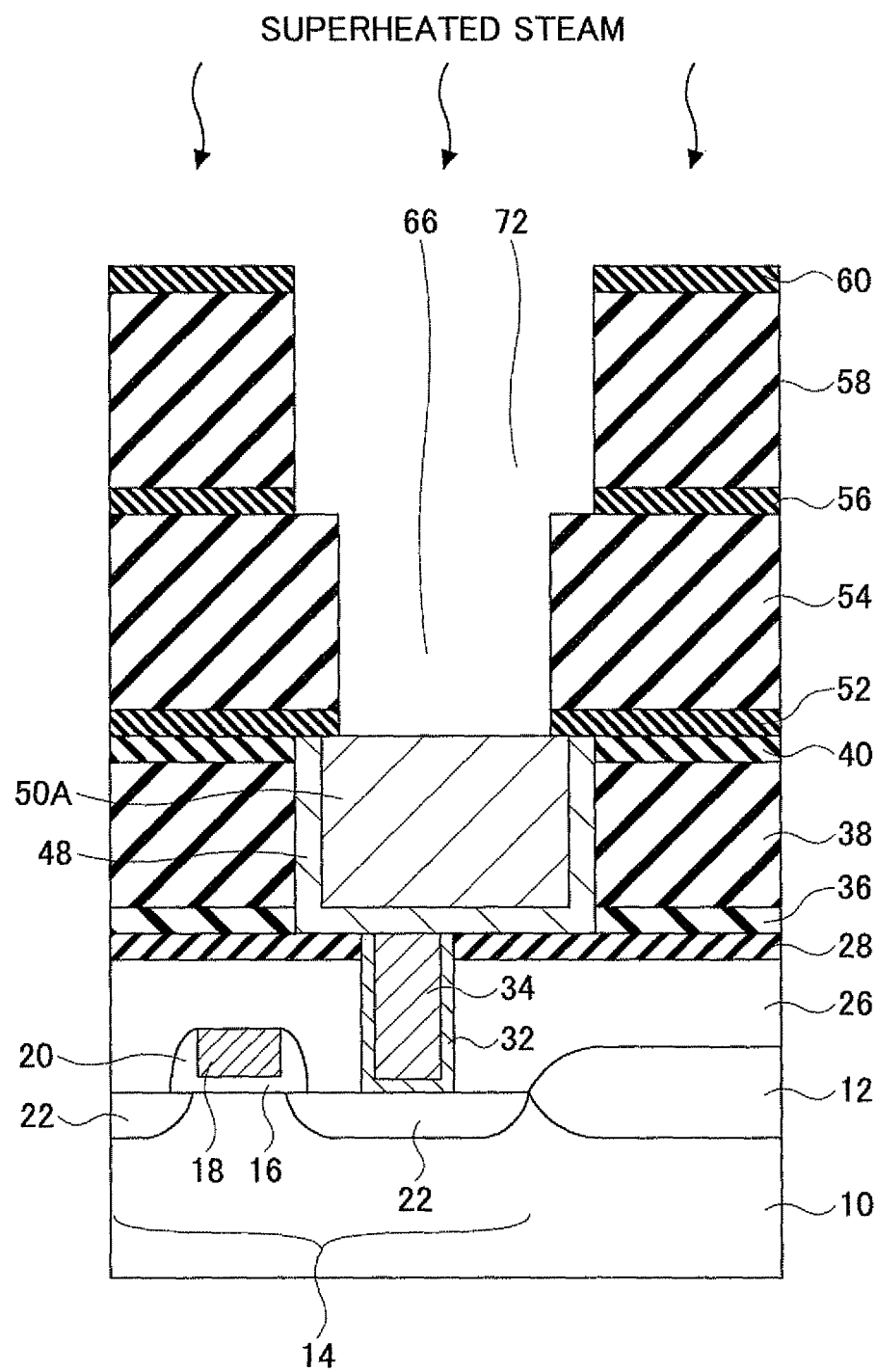

Next, in the step of FIG. 1S, the resist film 68 is removed and the sidewall surface and bottom surface of the contact hole 66 and the sidewall surfaces and the bottom surface of the interconnection trench 72 are subjected to a cleaning process similar to that of the step of FIG. 1H while using a superheated steam. With this, the unreacted etching gas molecules CFx or the surface terminating fluorine adsorbed to bottom surface and sidewall surface of the contact hole 66 and the interconnection trench 72 are removed. In the present embodiment, the oxygen concentration level in the ambient is controlled to 0.4 volumetric % in this cleaning process conducted by the superheated steam.

More specifically, the processing space 111S inside the processing vessel 111 is purged by supplying, to the processing vessel 111, a nitrogen gas or a helium gas or an argon gas or a hydrogen gas into the processing vessel from the nitrogen gas source 113N or the helium gas source 113H or the argon gas source 113Ar or the hydrogen gas source 113H so as to fill the processing space 111S and further by evacuating the processing space by the turbo molecular pump 112A and the rotary pump 112B, until the oxygen concentration level in the processing space is lowered to 0.6 volumetric % or lower, such as 0.4 volumetric %.

According to the present embodiment, the superheated steam contains hydrogen ions (H+) with high concentration level, while the hydrogen ions works to effectively reduce copper oxides when the HF formed as a byproduct in the reaction (1) explained previously is dissolved. Further, because the oxygen concentration level of the ambient at the time of the cleaning is suppressed to 0.6 volumetric % or less, the oxides formed on the surface 50A of the Cu interconnection pattern 50A exposed at the bottom of the contact hole 66 are reduced effectively, and there is obtained a fresh surface free from oxides is obtained for the exposed surface of the Cu interconnection pattern 50A.

With regard to the control of the oxygen concentration level at the time of the cleaning step by the superheated steam, a detailed explanation will be made with reference to the next embodiment.

Figure 1T:
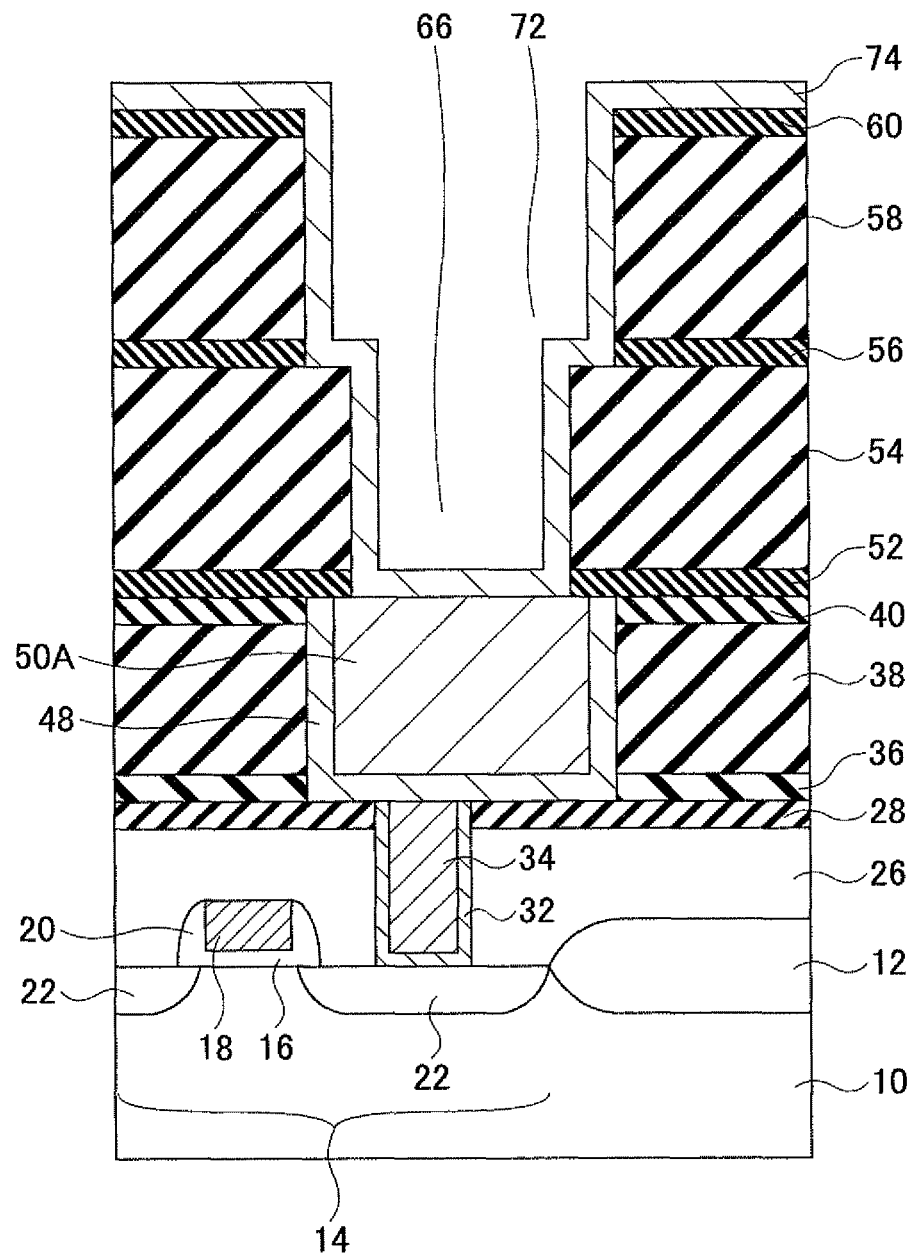
Figure 1U:
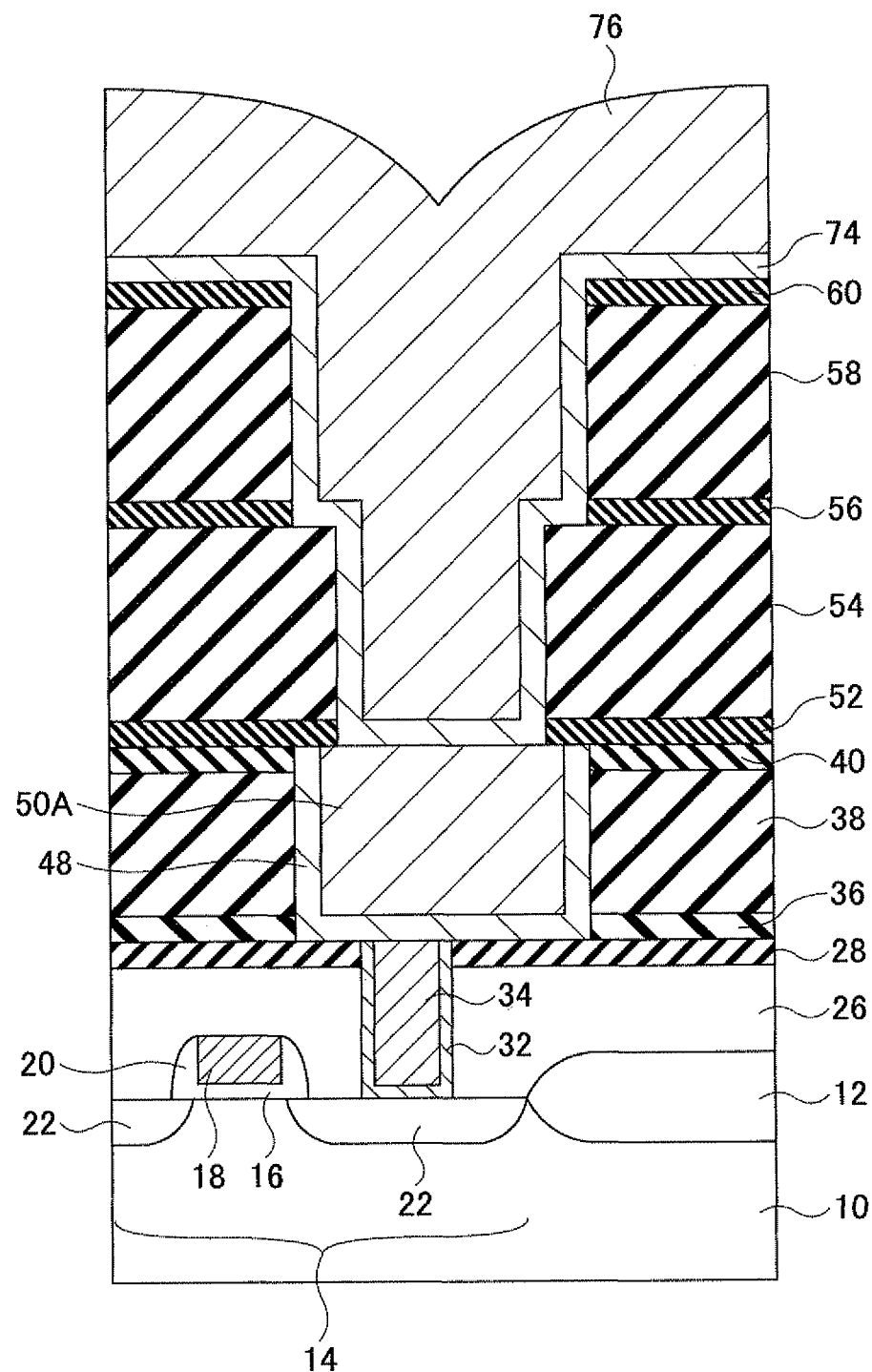

Further, in the step of FIG. 1T, the sidewall surface and bottom surface of the interconnection trench 72 and the contact hole 66 are covered with a barrier metal film 74 similar to the barrier metal film 48 and a Cu seed layer (not illustrated) is formed further on the barrier metal film 72 of FIG. 1T in the step of FIG. 1U by a sputtering process with a film thickness of 10 nm, for example.

Further, in the step of FIG. 1U, a Cu film 76 is formed with a film thickness of 1400 nm, for example, so as to fill the contact hole 66 and the interconnection trench 72 by feeding electric current to the Cu seed film in a plating bath.

Figure 1V:
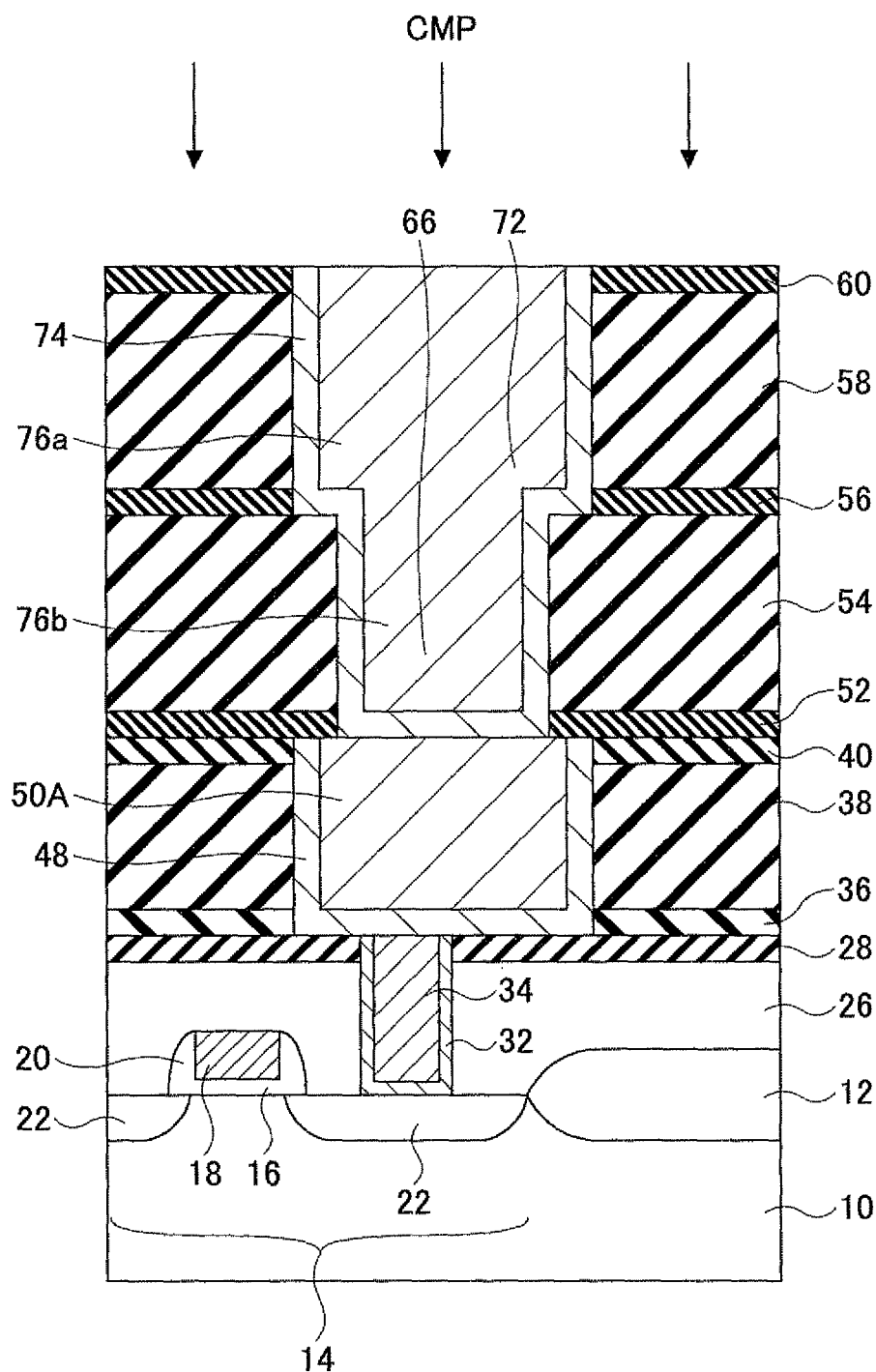

Further, in the step of FIG. 1V, the Cu film 76 and the underlying barrier metal film 74 are polished by a chemical mechanical polishing process until the top surface of the insulting diffusion barrier film 60 is exposed, and as a result, there is obtained an interconnection structure having a planarized surface such that the interconnection trench 77 is filled with a Cu interconnection pattern 76a and the contact hole 66 is filled with a Cu via-plug 76b extending out from the Cu interconnection pattern 76a.

Figure 1W:
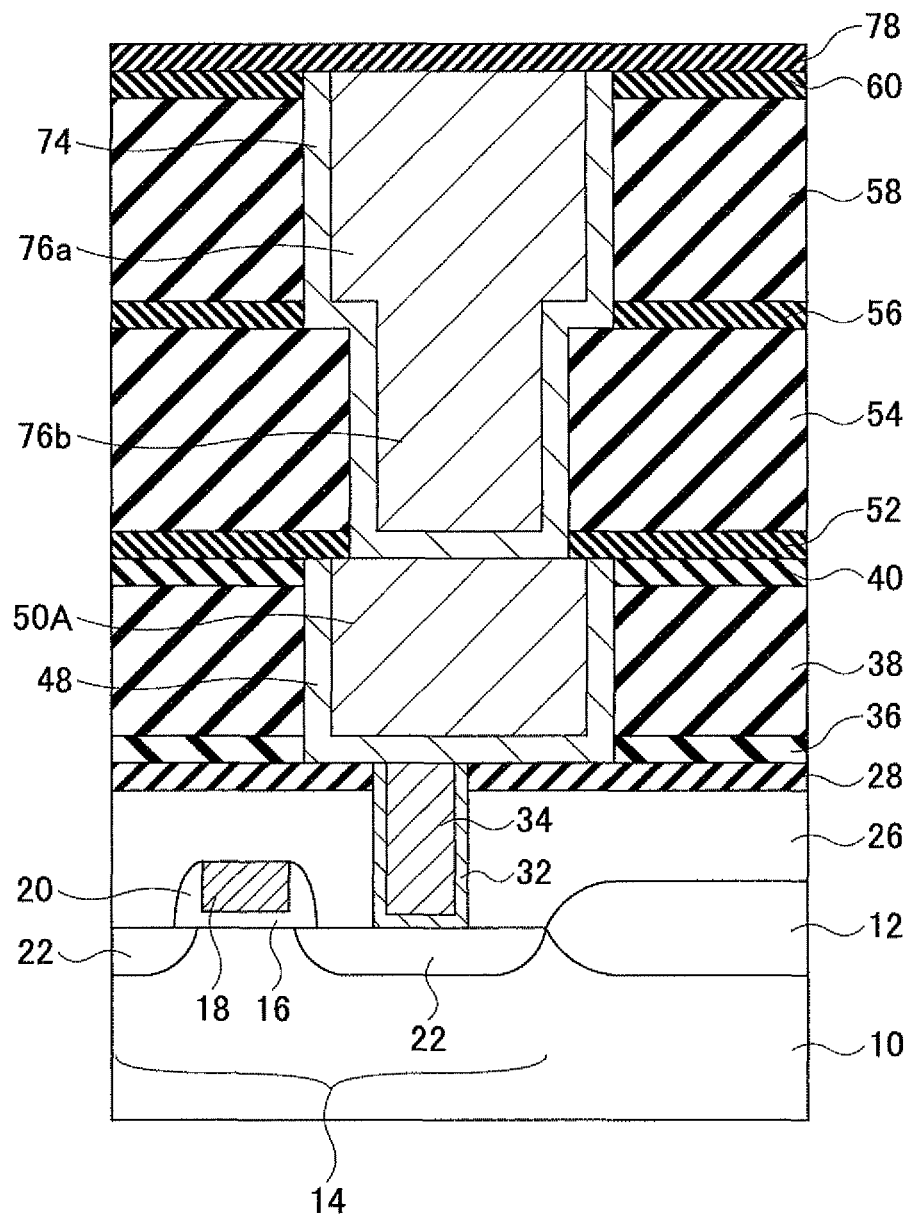

Further, in the step of FIG. 1W, the surface of the Cu interconnection pattern 76a is covered with an insulating diffusion barrier film (cap film) 78 of SiC having a film thickness of 30 nm, for example.

Further, by repeating the foregoing process as necessary, it is possible to form a multilayer interconnection structure that includes a third interconnection layer not illustrated.

With the multilayer interconnection structure thus formed, the contact resistance between the Cu interconnection pattern 50A and the Cu via-plug 76b is reduced in view of the fact that the oxide formation at the surface of the interconnection pattern 50A is suppressed and in view of the fact that the oxide formation at the interface between the barrier metal film 48 and the interlayer insulation film 38 or the SiC etching stopper film 28 is reduced, and further in view of the fact that the oxide formation at the interface between the interlayer insulation film 54 or 58 and the barrier metal film 74 is reduced. As a result, it becomes possible to obtain a multilayer interconnection structure of low contact resistance.

With regard to the semiconductor device thus formed, the yield of production was measured by forming the interconnection patterns and the via-plugs such that one million conductive plugs are connected electrically in series, and it was shown that a yield of 96.1-100% was attained. In contrast, in the case of a comparative example in which a plasma processing is used in the steps of FIGS. 1H and 1S in place of the cleaning process by the superheated steam, the yield attained was only 51.1-57.6%. Further, increase of resistance was tested by a high temperature exposure test at 200° C. and it was shown that, with the present embodiment, the increase of resistance was only 3.2-3.8% after exposure for 168 hours and only 3.6-4.5% after exposure for 504 hours, while in the case of the foregoing comparative example, an increase of 12.3-37.6% was observed after exposure for 168 hours and 26.3-46.2% was observed after exposure for 504 hours.

Table 2 below summarizes the foregoing results.

TABLE 2

| | Method | Diffusion Barrier | Proportion of Metal Oxide at Diffusion Barrier/Insulation Film Interface |
|---|---|---|---|
| COMPARATIVE EXAMPLE 1 | Conventional (Plasma) | Ta | 64.12 |
| COMPARATIVE EXAMPLE 2 | | Ti | 58.45 |
| EXAMPLE 1 | This Embodiment (Superheated Steam) | Ta | 25.27 |
| EXAMPLE 2 | | Ti | 22.43 |

| | | Increase of Interconnection Resistance after High Temperature Exposure test at 200° C. | |
|---|---|---|---|
| | Yield (%) | After 168 Hours | After 504 Hours |
| COMPARATIVE EXAMPLE 1 | 51.1 | 37.6 | 46.2 |
| COMPARATIVE EXAMPLE 2 | 57.6 | 12.3 | 26.3 |
| EXAMPLE 1 | 96.1 | 3.8 | 4.5 |
| EXAMPLE 2 | 100 | 3.2 | 3.6 |

In Table 2, it should be noted that "COMPARATIVE EXAMPLE 1" indicates the case in which tantalum (Ta) is used in the foregoing comparative example as the barrier metal films 48 and 74, while "COMPARATIVE EXAMPLE 2" indicates the case in which titanium (Ti) is used in the foregoing comparative example for the barrier metal films 48 and 74. Further, "EXAMPLE 1" indicates the case in which tantalum (Ta) is used in the foregoing embodiment for the barrier metal films 48 and 74 while "COMPARATIVE EXAMPLE 2" indicates the case in which titanium (Ti) is used in the foregoing embodiment for the barrier metal films 48 and 74.

Further, the column "Proportion of Metal Oxide at Diffusion Barrier/Insulation Film Interface" of Table 2 represents the proportion of metal oxide at the diffusion barrier/insulation film interface, which is derived from the relationship between the photoelectron intensity and binding energy obtained by XPS measurement with regard to the Ta4f orbital or Ti2p orbital for the specimen of the state of FIG. 1I after the thermal annealing process.

Figure 7A:
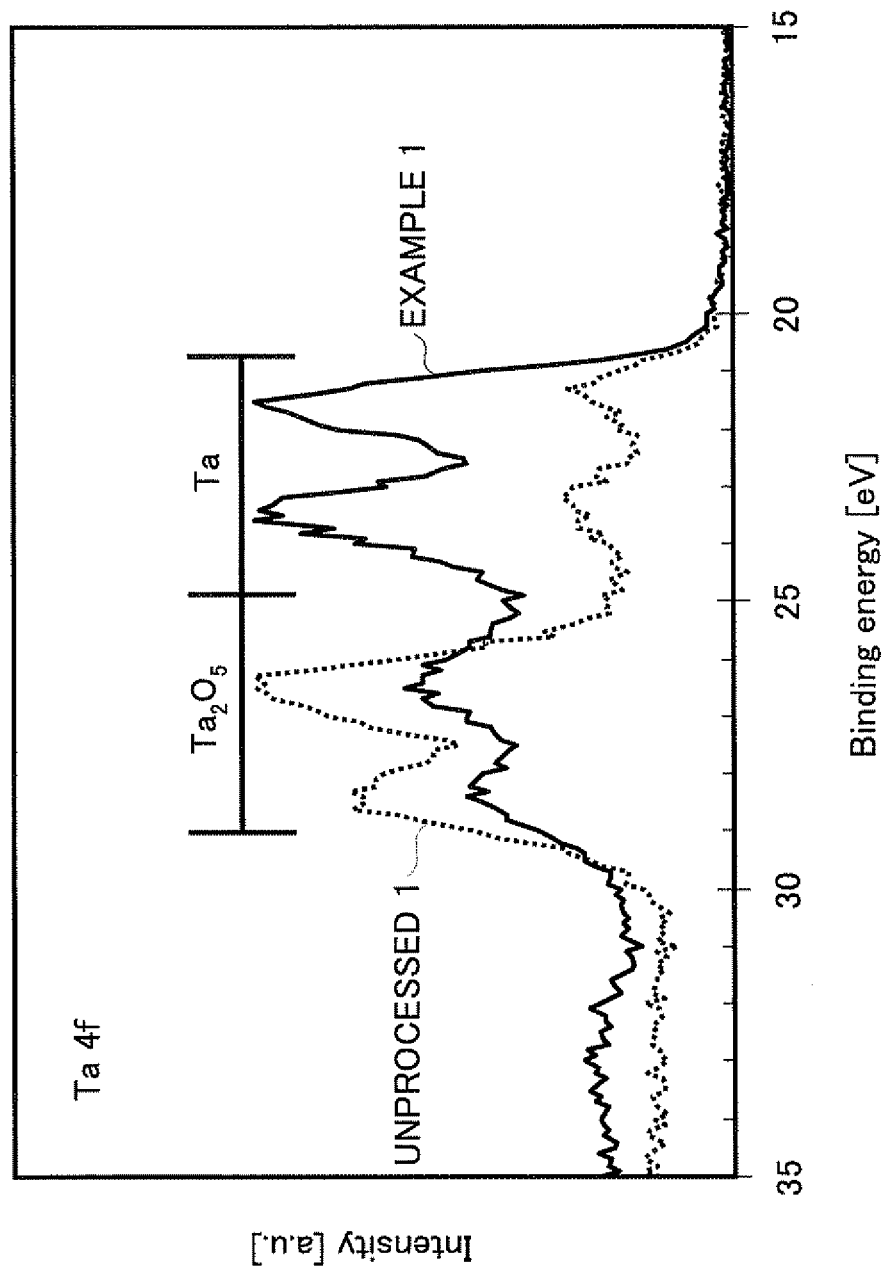
FIG. 7A is a XPS spectrum diagram representing oxide formation conducted for the first embodiment.
Figure 7B:
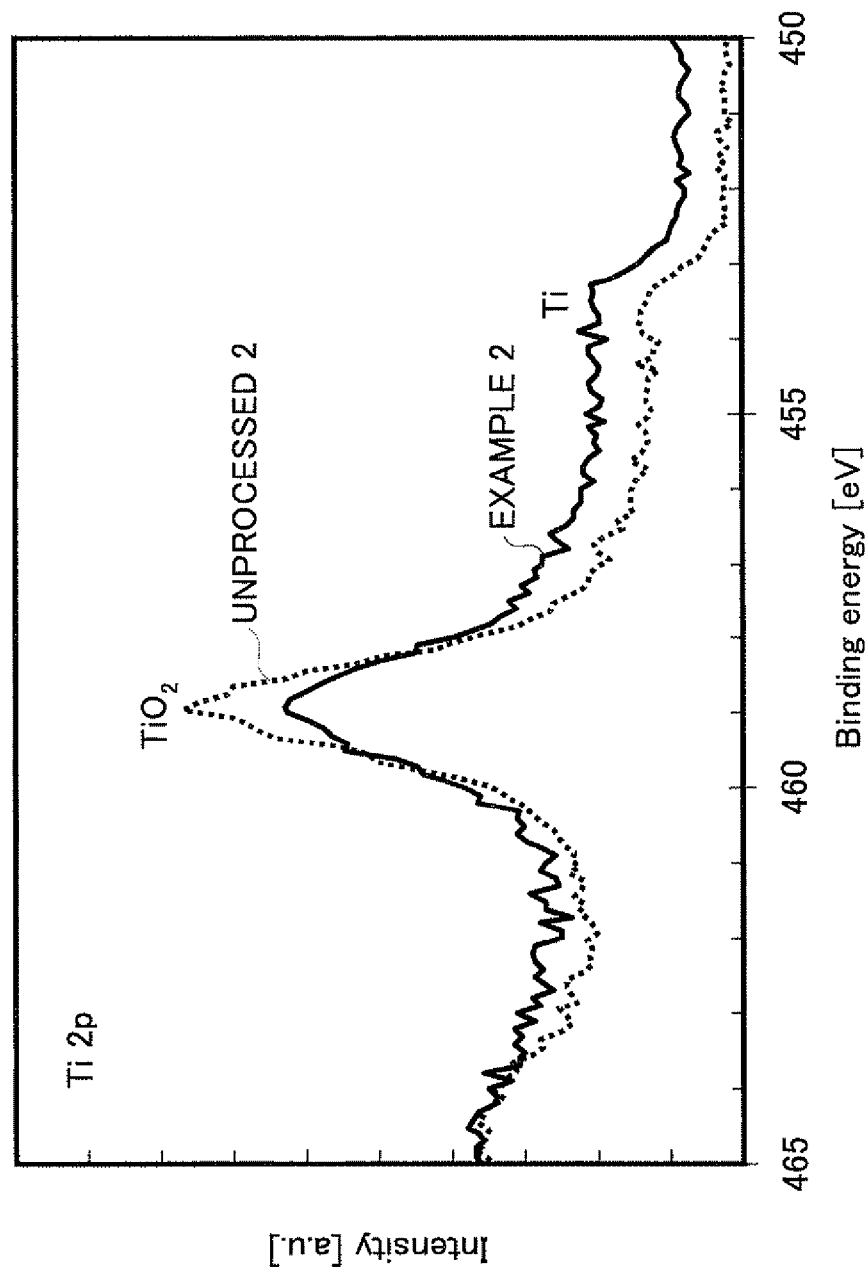
FIG. 7B is a XPS spectrum diagram representing another oxide formation conducted for the first embodiment.

FIG. 7A represents the result of the XPS measurement for the structure of FIG. 1I for the case Ta is used for the barrier metal film 48, while FIG. 7B represents the result of the XPS measurement for the structure of FIG. 1I for the case Ti is used for the barrier metal film 48. In FIG. 7A, "EXAMPLE 1" corresponds to the Example 1 of Table 1, while "UNPROCESSED 1" corresponds to the case in which the cleaning process by the superheated steam of FIG. 1H is omitted. In FIG. 7B, "EXAMPLE 2" corresponds to the Example 2 of Table 2, while "UNPROCESSED 2" corresponds to the case in which the cleaning process by the superheated steam of FIG. 1H is omitted. Actually, the measurements of FIGS. 7A and 7B were conducted upon the specimen of FIG. 6C after forming a barrier metal film corresponding to the barrier metal film 48 and applying annealing in vacuum ($1 \times 10^{-5}$ Torr) at 400° C. for 60 minutes in a state of the specimen in which the diffusion barrier film is peeled off from the interlayer insulation film in a glove box of $N_2$ atmosphere after the foregoing annealing. The measurement was conducted for the peeled surface thus obtained.

Referring to FIGS. 7A and 7B, it can be seen that the peak of $Ta_2O_5$ is lower in EXAMPLE 1 as compared with the Comparative Example 1. Likewise, it can be seen that the peak of $TiO_2$ is lower in EXAMPLE 2 as compared with the Comparative Example 2. Further, it should be noted that "Proportion of Metal Oxides at Diffusion Barrier/Insulation Film Interface" of FIG. 2 is derived from FIGS. 7A and 7B.

Figure 8A:
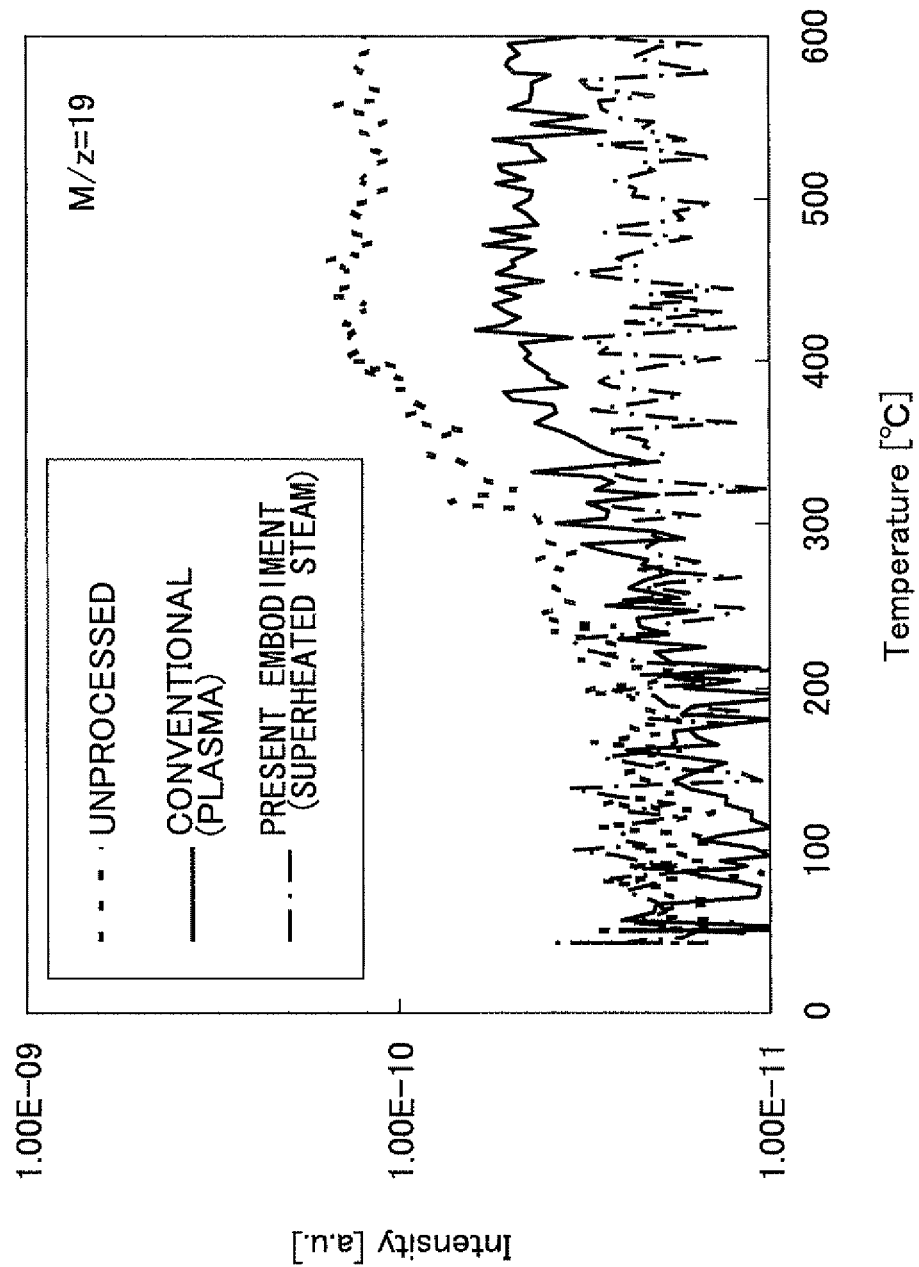
FIG. 8A is a diagram representing a result of TDS analysis conducted for the first embodiment.

Further, FIGS. 8A and 8B represent the desorption of fluorine and water for the specimen of FIG. 6D conducted by a TDS analysis.

Referring to FIG. 8A, it can be seen that the amount of the fluorine (F) released with the annealing is largest in the specimen designated as "UNPROCESSED" and hence the specimen in which both of the cleaning process by the superheated steam and the processing with plasma are omitted. Further, the amount of the fluorine released with the annealing is next largest with the specimen designated as "CONVENTIONAL" in which the plasma processing is applied in place of the superheated steam processing of FIG. 1H. Contrary to the foregoing, with the specimen designated as "PRESENT EMBODIMENT", and thus, with the specimen in which the cleaning processing of FIG. 1H is conducted by the superheated steam, it can be seen that there is caused substantially no release of fluorine.

Further, with reference to FIG. 8B, it can be seen that there is substantially no difference in the amount of water released upon annealing between the specimen designated as "UNPROCESSED" and thus the specimen in which both of the cleaning process of FIG. 1H by the superheated steam and the plasma processing are omitted and the specimen designated as "Conventional" in which the plasma processing is conducted in place of the superheated steam processing of FIG. 1H, in that a large amount of water is released with heating in both of these specimens. Contrary to the foregoing, with the specimen designated as "Embodiment", and thus with the specimen in which the cleaning processing of FIG. 1H is conducted with the superheated steam, it can be seen that the amount of the released water is substantially decreased.

Figure 9:
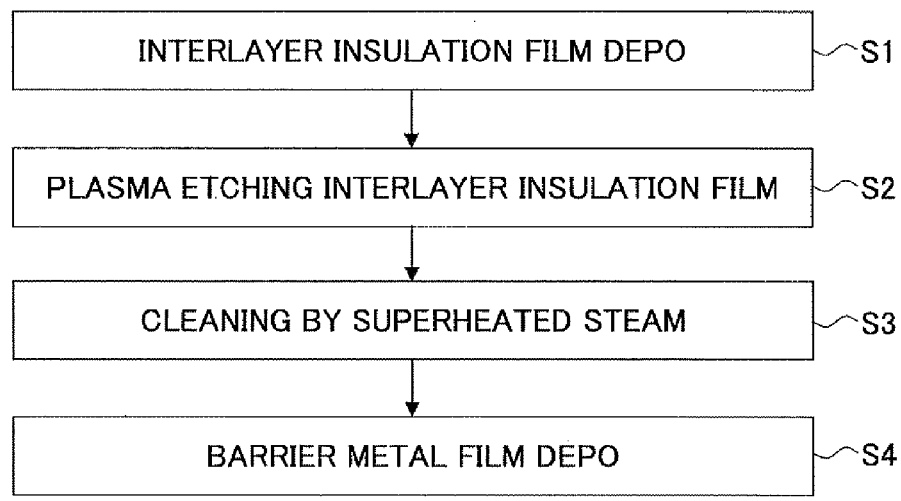
FIG. 9 is a flowchart representing an outline of the cleaning process that uses the superheated steam according to the first embodiment.
Figure 10:
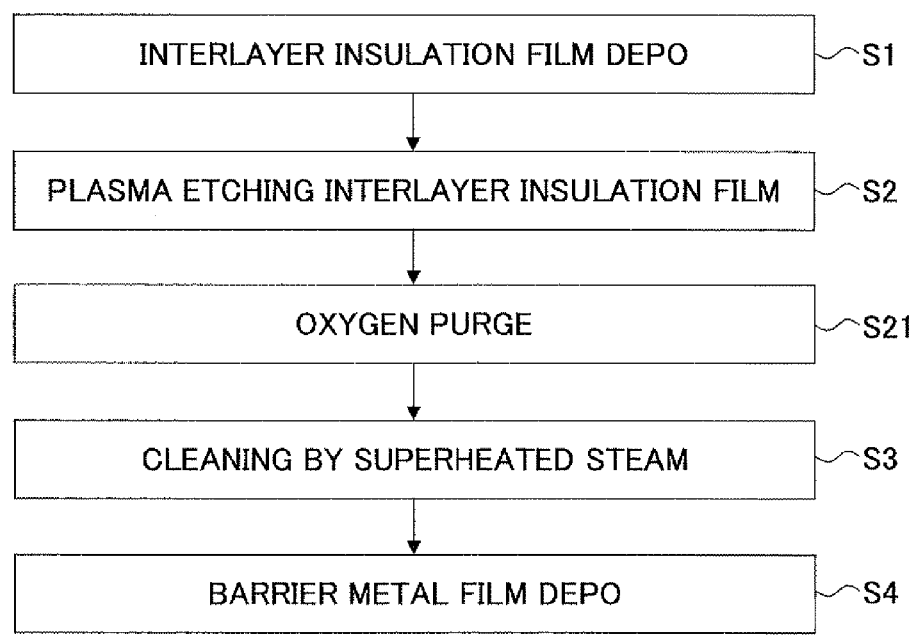

FIG. 9 is a flowchart summarizing the first embodiment.

Referring to FIG. 9, the present embodiment deposits an interlayer insulation film upon an underlying structure in a step 1 and the interlayer insulation film is subjected to etching in a step 2 by a plasma etching that uses a CF-based etching gas.

Further, a cleaning by the superheated steam is applied in a step 3 to the etching surface formed as a result of the etching with the step 2 and residual fluorine and water are removed from the etching surface.

Further, a barrier metal film is formed in a step 4 upon the surface thus cleaned.

In the present embodiment, various interlayer insulation films containing Si can be used as noted previously. For the barrier metal film, various refractory metals such as Ta, Ti, Ru, Zr, Hf, V, Nb, Cr, Mo, W, Mn, and the like, or a conductive nitride film thereof may be used alone or in the form of stacked film.

Second Embodiment

In the preceding embodiment, it should be noted that the cleaning process of FIG. 1S is conducted while setting the oxygen concentration level in the ambient to 0.4 volumetric %.

This is because it was discovered that there is caused coloration in the surface of the Cu interconnection pattern when exposed in the step 1S by the openings 66 and 72 under a high oxygen concentration level, indicating that there is caused formation of oxides on the surface.

Table 3 represents the results of investigation made with regard to the coloration taking place in the step of FIG. 1S in the surface of the Cu interconnection pattern 50A while exposing the surface to the ambient of various oxygen concentration levels. Here, the oxygen concentration level of the ambient was controlled by purging the processing vessel 111 repeatedly by the Ar gas, He gas, nitrogen gas or hydrogen gas and is checked by an oxygen concentration level meter 111O provided to the processing vessel 111.

TABLE 3

| Apparatus | Oxygen Concentration Level (%) | Cu Oxidation (Coloration) |
| --- | --- | --- |
| Conventional | 16.3 | YES |
| Present | 10.4 | YES |
| Embodiment | 5.2 | YES |
|  | 1 | YES |
|  | 0.8 | YES |
|  | 0.6 | NO |
|  | 0.4 | NO |

Referring to FIG. 3, it can be seen that there occurs coloration in the exposed Cu interconnection pattern 50A when the oxygen concentration level is 0.8 volumetric % or higher, indicating oxide formation on the surface. When the oxygen concentration level in the cleaning process is 0.6 volumetric % or lower, on the other hand, no coloration was observed in the Cu interconnection pattern 50A, indicating that oxide formation is suppressed effectively. Because of these reasons, the cleaning process of FIG. 1H or FIG. 1S by the superheated steam is conducted in the previous embodiment while setting the oxygen concentration level to 0.4 volumetric %.

FIG. 10 is a flowchart representing a second embodiment that includes an oxygen purging step before the cleaning step. In FIG. 10, those steps explained before are designated by the same reference numerals and the description thereof will be omitted.

Referring to FIG. 10, the present embodiment carries out a step 21, after the plasma etching of the interlayer insulation film in the step 2 but before the cleaning process of the step 3 by the superheated steam, such that the oxygen concentration level in the processing space 111S inside the processing vessel 111 is reduced to 0.6 volumetric % or less by purging the processing space 111S.

Figure 11:
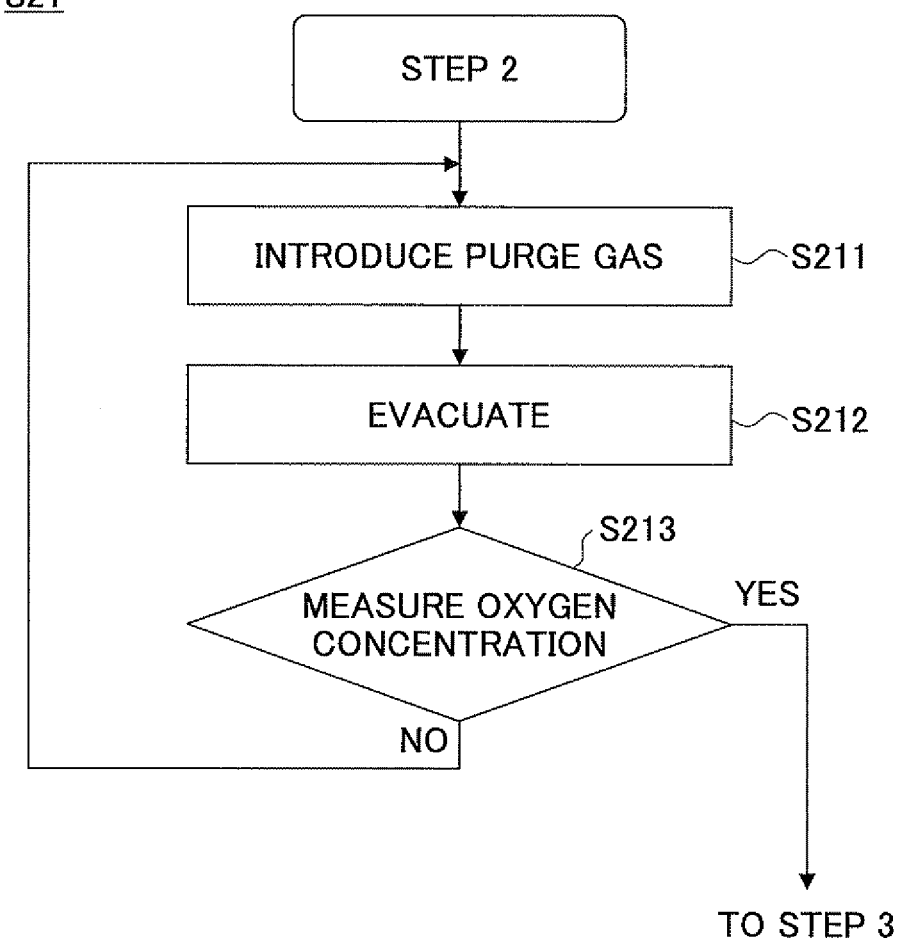
FIG. 11 is a flowchart representing an example of oxygen purge process used in the flowchart of FIG. 10.

FIG. 11 is a flowchart representing an outline of an example of the oxygen purging step 21.

Referring to FIG. 11, an inert gas such as an Ar gas, a He gas, a nitrogen gas, etc., and further a reducing gas such as a hydrogen gas are introduced in a step 211 into the processing vessel 111 and fill the processing space 111S with the inert gas or the reducing gas.

Further, in a step 212, the valve 112C is opened and the processing space 111S is evacuated by the turbo molecular pump 112A and the rotary pump 112B. With this, oxygen is removed from the processing space 111S together with the inert gas or the reducing gas.

Further, in a step 213, the oxygen concentration level inside the processing space 111S is measured by the oxygen concentration level meter 111O, and the steps 211-213 are repeated until the oxygen concentration level in the processing space 111S becomes equal to or lower than 0.6 volumetric %.

Further, it should be noted that the purging process of the step 21 is not limited to the purging process represented in FIG. 11 that uses an inert gas or a reducing gas but it is also possible to use a less efficient vacuum purging process.

As noted in the previous embodiment, the step of FIG. 1H is conducted to expose the tungsten plug. Thus, because the Cu interconnection pattern is not exposed in the process of FIG. 1H, it is not absolutely necessary to suppress the oxygen concentration level of the ambient to 0.6 volumetric % or less in the cleaning process of FIG. 1H conducted by using the superheated steam. Nevertheless, such a control of the oxygen concentration level is certainly preferable.

Further, while the contact hole 66 exposes the underlying interconnection pattern, the opening that is cleaned by the superheated steam is not limited to the contact hole that exposes the underlying interconnection pattern as can be seen in FIG. 1S, in which it should be noted that the opening 72 forming the interconnection trench does not expose the underlying interconnection pattern except for the part in which the opening 66 constituting the via-plug is formed.

It is advantageous to carry out the cleaning process by the superheated steam of FIG. 1H and FIG. 1S under an ordinary pressure or lower. By doing so, it becomes possible to use an ordinary evacuation system such as the turbo molecular pump 112A or the rotary pump 112B. As explained with reference to FIG. 5, the specific dielectric constant of the superheated steam takes the value of about 1.0, irrespective of the temperature as long as the pressure is equal to or lower than the ordinary pressure.

Further, the temperature of the superheated steam in the cleaning process of the step of FIGS. 1H and 1S is not limited to 250° C. However, sufficient cleaning effect is not attained when the temperature is reduced to 100° C. or lower. Further, when the temperature exceeds 400° C., there is a concern that the semiconductor devices formed on the substrate may be damaged. From these considerations, it is preferable to set the temperature of the superheated steam to the range of 100° C.-400° C. in the cleaning process.

According to the foregoing embodiments, it becomes possible to remove the compound containing fluorine or terminating fluorine from the sidewall surface and bottom surface of the opening in advance of the film formation of the barrier metal film.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A method of forming an interconnection structure, comprising:
    forming an opening in an insulation film by a dry etching process that uses an etching gas containing fluorine;
    cleaning a bottom surface and a sidewall surface of said opening by exposing said bottom surface and said sidewall surface of said opening to a superheated steam in an ambient of which oxygen concentration level is equal to or lower than 0.6 volumetric %;
    covering said bottom surface and said sidewall surface of said opening with a barrier metal film;
    depositing a conductor film on said insulation film and filling said opening with said conductor film via said barrier metal film;
    forming an interconnection pattern by said conductor film in said opening by polishing said conductor film and said barrier metal film underneath said conductor film by a chemical mechanical polishing process until a surface of said insulation film is exposed.

2. The method as claimed in claim 1, wherein said cleaning is conducted under a pressure equal to or lower than an ordinary pressure.

3. The method as claimed in claim 1, wherein said cleaning is conducted by exposing said bottom surface and said sidewall surface of said opening to said superheated steam of a temperature of 100° C.-400° C.

4. The method as claimed in claim 3, wherein said superheated steam is introduced into a processing vessel with a temperature higher than a temperature at which said bottom surface and said sidewall surface of said opening are exposed to said superheated steam.

5. The method as claimed in claim 4, wherein said cleaning is conducted in a state in which said insulation film is heated to said temperature of said superheated steam to which said sidewall surface and said bottom surface of said opening are exposed.

6. The method as claimed in claim 1, wherein said ambient is any of an inert ambient or a reducing ambient.

7. The method as claimed in claim 1, further comprising, after said forming of said opening but before said cleaning, lowering said oxygen concentration level of said ambient to 0.6 volumetric % or lower.

8. The method as claimed in claim 7, wherein said lowering of said oxygen concentration level is conducted by repeating a purging process that includes introducing an inert gas or a reducing gas into a processing vessel in which said cleaning is conducted and evacuating said processing vessel subsequently.

9. The method as claimed in claim 8, wherein said oxygen concentration level is measured in each purging process.

10. The method as claimed in claim 1, wherein said forming of said opening is conducted such that said opening exposes a Cu film underneath said insulation film.

11. The method as claimed in claim 10, wherein said barrier metal film comprises a stack of a plurality of layers.

12. The method as claimed in claim 1, wherein said insulation film contains Si.

13. The method as claimed in claim 12, wherein said insulation film is selected from a group consisting of an organosiloxane film, a hydrogenated siloxane film, an organic polymer film containing Si, and a porous film thereof.

14. The method as claimed in claim 1, wherein said barrier metal film is formed of a film selected from the group consisting of Ti, Ta, Ru, Zr, Hf, V, Nb, Cr, Mo, W, Mn and a conductive nitride thereof.

15. A method of fabricating a semiconductor device, comprising:

forming an opening in an insulation film by a dry etching process that uses an etching gas containing fluorine;

cleaning a bottom surface and a sidewall surface of the opening by exposing said bottom surface and said sidewall surface of said opening to a superheated steam in an ambient of which oxygen concentration level is equal to or lower than 0.6 volumetric %;

covering said bottom surface and said sidewall surface of the opening with a barrier metal film;

depositing a conductor film on said insulation film and filling said opening with said conductor film via said barrier metal film; and forming an interconnection pattern by said conductor film in said opening by polishing said conductor film and said barrier metal film underneath said conductor film by a chemical mechanical polishing process until a surface of said insulation film is exposed.

* * * * *